(12) United States Patent
Jung et al.

(10) Patent No.: US 8,854,855 B2
(45) Date of Patent: Oct. 7, 2014

(54) SEMICONDUCTOR MEMORY DEVICE AND METHOD FOR MANUFACTURING THE SAME

(71) Applicant: SK hynix Inc., Gyeonggi-do (KR)

(72) Inventors: Sung Wook Jung, Gyeonggi-do (KR); Jung Seok Oh, Seoul (KR)

(73) Assignee: SK Hynix Inc., Gyeonggi-Do (KR)

( * ) Notice: Subject to any disclaimer, the term of this patent is extended or adjusted under 35 U.S.C. 154(b) by 22 days.

(21) Appl. No.: 13/830,594

(22) Filed: Mar. 14, 2013

(65) Prior Publication Data

US 2014/0112049 A1 Apr. 24, 2014

(30) Foreign Application Priority Data

Oct. 22, 2012 (KR) ......................... 10-2012-0117221

(51) Int. Cl.
*G11C 5/06* (2006.01)
*H01L 21/28* (2006.01)

(52) U.S. Cl.
CPC ............ *H01L 21/28008* (2013.01); *G11C 5/06* (2013.01)
USPC .................................. 365/72; 365/63; 365/51

(58) Field of Classification Search
USPC .......... 365/72, 63, 51, 148; 257/324; 438/586
See application file for complete search history.

(56) References Cited

U.S. PATENT DOCUMENTS 8,363,476 B2 * 1/2013 Lue et al. ................. 365/185.18

FOREIGN PATENT DOCUMENTS

KR 1020110034946 4/2011
KR 10-1096199 12/2011

* cited by examiner

*Primary Examiner* — David Lam
(74) *Attorney, Agent, or Firm* — IP & T Group LLP

(57) ABSTRACT

The present technology includes a semiconductor memory device and a method of manufacturing the same. The semiconductor device includes insulation patterns and cell word lines alternately stacked on a substrate. A cell channel layer is formed through the insulation patterns and the cell word lines. A select channel layer is connected to the cell channel layer, and the select channel layer has a resistance higher than a resistance of the cell channel layer. A select line surrounds the select channel layer.

20 Claims, 17 Drawing Sheets

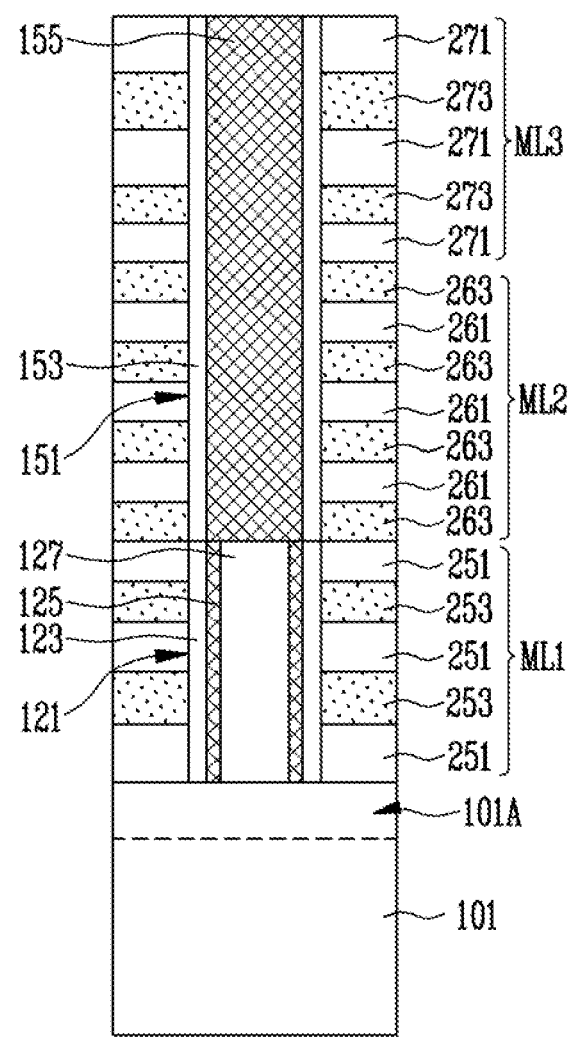

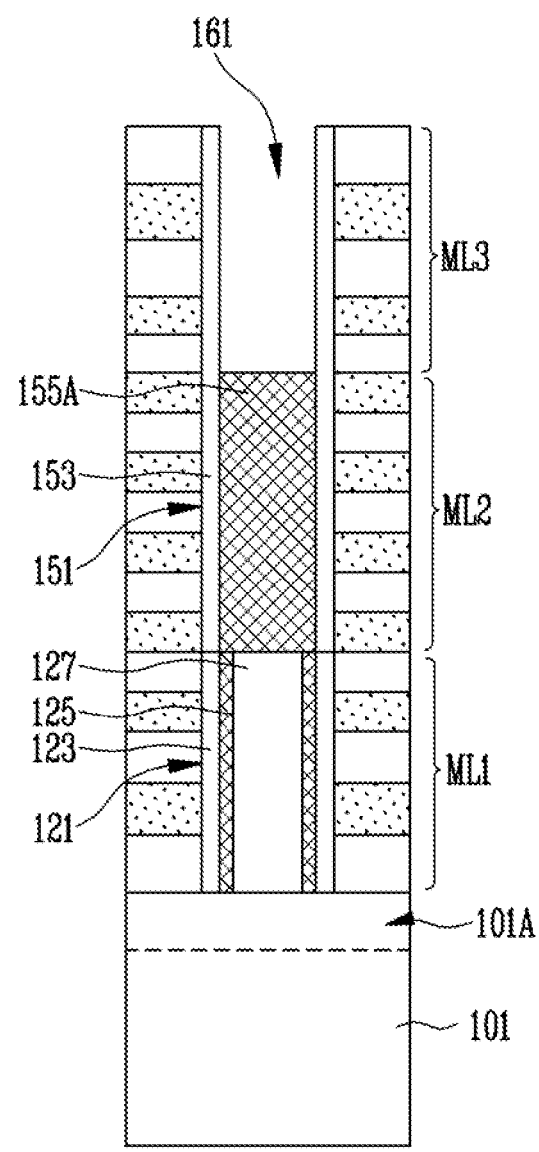

SEMICONDUCTOR MEMORY DEVICE AND METHOD FOR MANUFACTURING THE SAME

CROSS-REFERENCE TO RELATED APPLICATION

This application is based on and claims priority from Korean Patent Application No. 10-2012-0117221, filed on Oct. 22, 2012, with the Korean Intellectual Property Office, the disclosure of which is incorporated herein in its entirety by reference.

BACKGROUND

1. Field

The present invention relates to a semiconductor memory device and a method of manufacturing the same, and more particularly, to a nonvolatile memory device and a method of manufacturing the same.

2. Discussion of Related Art

In order to improve a degree of integration of a semiconductor memory device, a 3D semiconductor memory device in which a memory cell arrangement is implemented to have three dimensions has been suggested. Especially, various technologies for implementing a memory cell arrangement of a NAND flash memory device that is a nonvolatile memory device to have three dimensions have been suggested.

The NAND flash memory device includes a plurality of memory strings. Each memory string includes a plurality of memory cells connected in series between a first select transistor and a second select transistor. In order to implement the memory string in a 3D structure, the first select transistor, memory cells, and the second select transistor are formed along a channel layer protruding from an upper portion of the substrate.

The channel layer of the 3D nonvolatile memory device is formed by depositing a polysilicon layer along surfaces of channel holes passing through insulation layers and conductive layers alternately stacked on the substrate. The polysilicon layer has larger resistance than that of single crystalline silicon. Accordingly, channel current flowing along the channel layer formed of the polysilicon layer when the nonvolatile memory device is operated is low, so that reliability of the nonvolatile memory device may deteriorate.

In order to improve channel current, the channel layer may be formed by filling inside the channel hole with a polysilicon layer. In this case, leakage current is increased, so that reliability of the nonvolatile memory device may deteriorate.

SUMMARY

The present invention has been made in an effort to provide a semiconductor memory device capable of improving reliability of a 3D nonvolatile memory device, and a method of manufacturing the same.

An exemplary semiconductor memory device includes insulation patterns and cell word lines alternately stacked on a substrate; a cell channel layer formed through the insulation patterns and the cell word lines; a select channel layer connected to the cell channel layer, the select channel layer having a resistance higher than a resistance of the cell channel layer; and a select line surrounding the select channel layers.

An exemplary method of manufacturing a semiconductor memory device includes forming a first stacked structure by in alternately stacking a plurality of first material layers and second material layers on a substrate; forming cell channel layers passing through the first stacked structure; and forming select channel layers to connected to the cell channel layers, respectively, wherein each of the select channel layers has a resistance that is greater than a resistance of each of the cell channel layers.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIGS. 3A to 3C are cross-sectional views illustrating an exemplary semiconductor memory device and a method of manufacturing the same;

DETAILED DESCRIPTION

Hereinafter an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Figure 1:
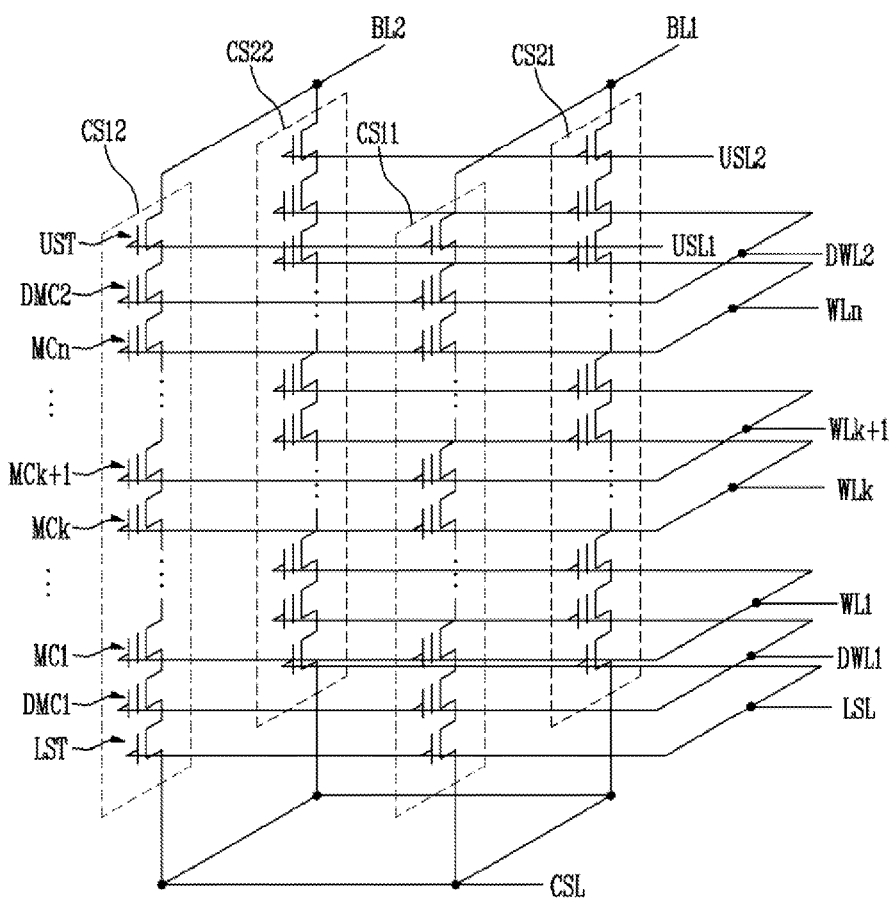
FIG. 1 is a circuit diagram of an exemplary semiconductor memory device.

FIG. 1 is a circuit diagram of a semiconductor memory device according to first and second embodiments of the present invention.

Referring to FIG. 1, an exemplary semiconductor memory device may include a common source line CSL, a plurality of bit lines BL1 and BL2, and a plurality of memory strings CS11, CS12, CS21, and CS22 connected between the common source line CSL and the plurality of bit lines BL1 and BL2.

The common source line CSL may be a conductive layer disposed on a semiconductor substrate, or an impurity region formed within the semiconductor substrate. The plurality of memory strings CS11, CS12, CS21, and CS22 are connected on the common source line CSL.

Each of the plurality of bit lines BL1 and BL2 is a conductive line disposed on the plurality of memory strings CS11, CS12, CS21, and CS22. A series of memory strings, arranged in a direction in which each of the plurality of bit lines BL1 and BL2 extends, is connected in parallel to the plurality of bit lines BL1 and BL2.

Each of the plurality of memory strings CS11, CS12, CS21, and CS22 includes a first select transistor LST, connected to the common source line CSL, a second select transistor UST, connected to one of the plurality of bit lines BL1 and BL2, and a plurality of memory cell transistors MC1 to MCn stacked between the first select transistor LST and the second select transistor UST. Each of the plurality of memory strings CS11, CS12, CS21, and CS22 may further include a first dummy memory cell transistor DMC1 connected between the first select transistor LST and the memory cell transistor MC1 adjacent to the first select transistor LST. Each of the plurality of memory strings CS11, CS12, CS21, and CS22 may further include a second dummy memory cell transistor DMC2 connected between the second select transistor UST and the memory cell transistor MCn adjacent to the second select transistor UST. The first select transistor LST, the first dummy memory cell transistor DMC1, the plurality of memory cell transistors MC1 to MCn, the second dummy memory cell transistor DMC2, and the second select transistor UST, included in each of the memory strings CS11, CS12, CS21, and CS22, are connected in series through a channel layer.

A gate of the first select transistor LST is connected to a first select line LSL, and a gate of the second select transistor UST is connected to a second select line USL1 or USL2. Gates of the plurality of memory cell transistors MC1 to MCn are connected to word lines WL1 to WLn. A gate of the first dummy memory cell transistor DMC1 is connected to a first dummy word line DWL1, and a gate of the second dummy memory cell transistor DMC2 is connected to a second dummy word line DWL2. Gates of the plurality of first select transistors LST, arranged on the same layer, may be commonly connected to the first select line LSL. Gates of the second select transistors UST, arranged in the same column on the same layer, may be commonly connected to each of the second select lines USL1 and USL2. Gates of the plurality of memory cells arranged on the same layer may be commonly connected to each of the word lines WL1 to WLn. The first dummy memory cell transistors DMC1, arranged on the same layer, may be commonly connected to the first dummy word line DWL1, and the second dummy memory cell transistors DMC2, arranged on the same layer, may be commonly connected to the second dummy word line DWL2. The first select line LSL, the first dummy word line DWL1, the word lines WL1 to WLn, the second dummy word line DWL2, and the second select line USL are conductive patterns sequentially stacked on the substrate.

FIGS. 2A to 2E are cross-sectional views illustrating an exemplary semiconductor memory device and a method of manufacturing the same. First, a memory string structure of an exemplary semiconductor memory device will be described in more detail with reference to FIG. 2E.

Figure 2A:
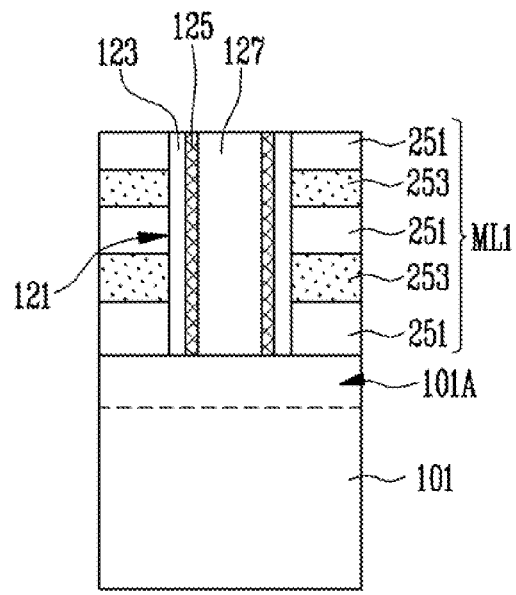
FIGS. 2A to 2E are cross-sectional views illustrating an exemplary semiconductor memory device and a method of manufacturing the same.
Figure 2B:
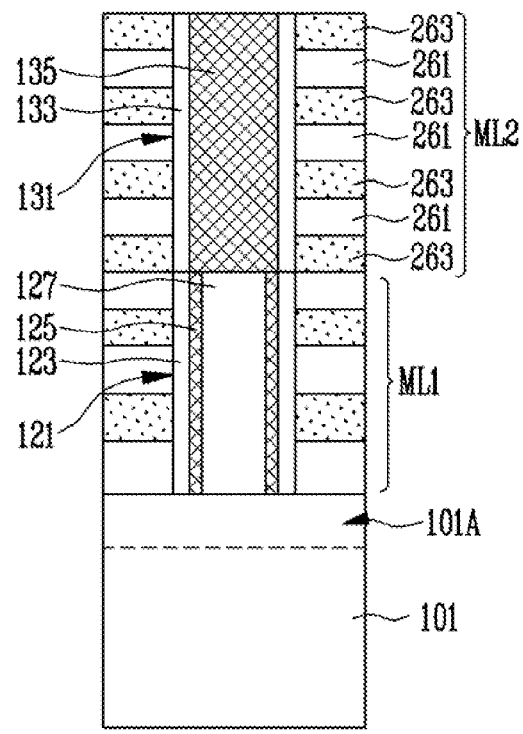
Figure 2C:
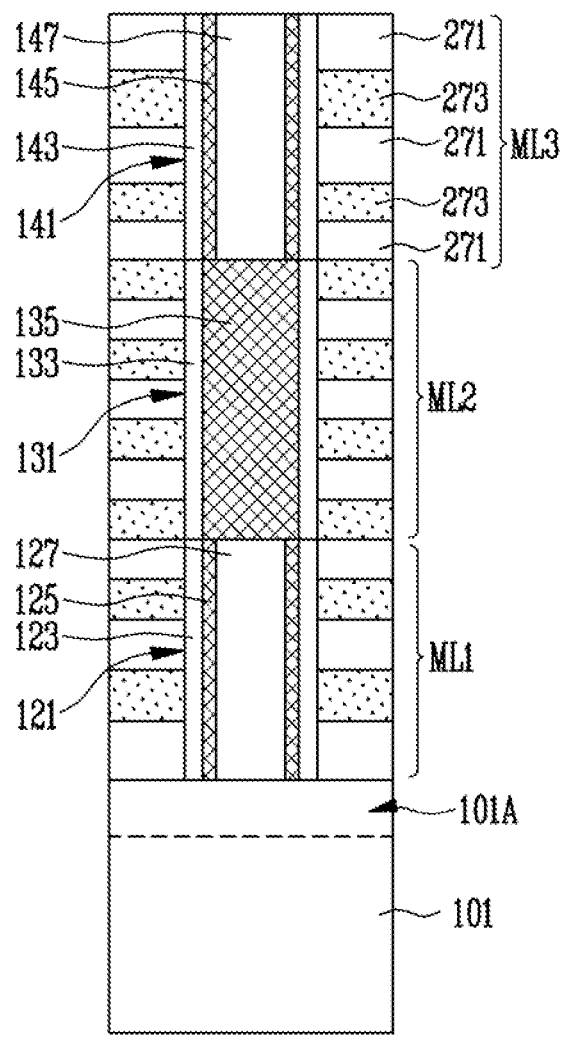
Figure 2D:
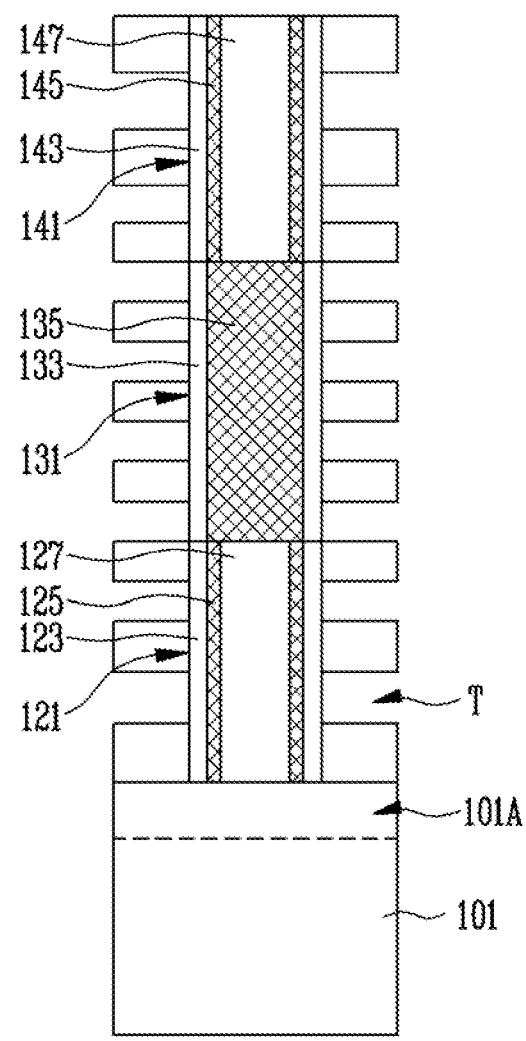
Figure 2E:
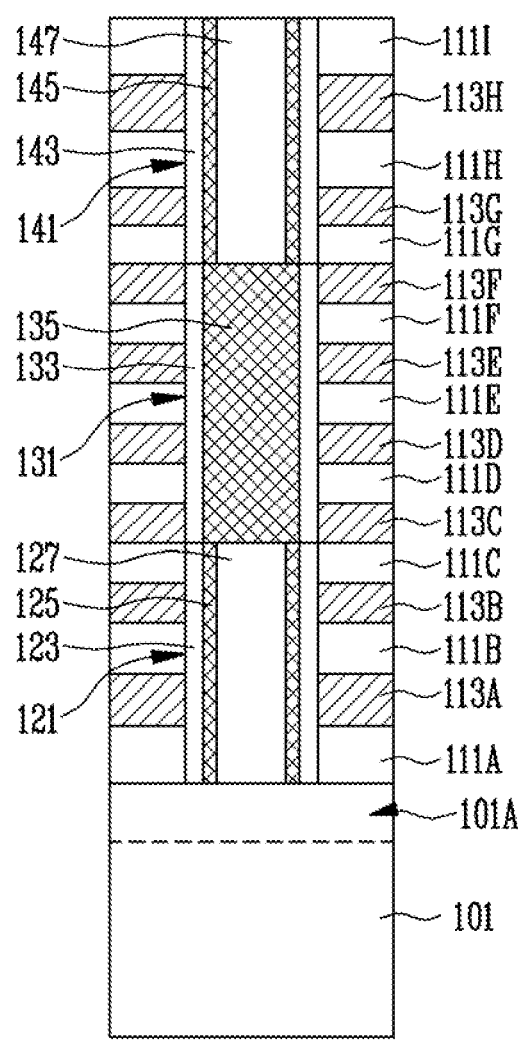

Referring to FIG. 2E, an exemplary memory string includes insulation patterns 111A to 111I and conductive patterns 113A to 113H alternately stacked on a semiconductor substrate 101, and channel layers 125, 135, and 145 stacked on the substrate 101. The channel layers 125, 135, and 145 penetrate at least one of the insulation patterns 111A to 111I and the conductive patterns 113A to 113H. Accordingly, the insulation patterns 111A to 111I and the conductive patterns 113A to 113H may be formed in a structure surrounding at least one of the channel layers 125, 135, and 145.

An impurity region 101A serving as a common source line may be formed within the substrate 101. Alternatively, the common source line may be formed as a conductive layer stacked between the substrate 101 and the insulation pattern 111A adjacent to the substrate 101.

At least one conductive pattern (for example, the conductive pattern 113A) adjacent to the semiconductor substrate 101 may be the first select line. A conductive pattern (for example, the conductive pattern 113B) formed above the conductive pattern 113A, which is the first select line, may be the first dummy word line. Conductive patterns (for example, the conductive patterns 113C to 113F) formed above the conductive pattern 113B, which is the first dummy word line, may be cell word lines. A conductive pattern (for example, the conductive pattern 113G) that is formed above the conductive pattern 113C to 113F, which are the cell word lines, may be the second dummy word line. At least one conductive pattern (for example, the conductive pattern 113H) formed above the conductive pattern 113G, which is the second dummy word line, may be the second select line. Thicknesses of the first and second select lines may be formed to be equal to or different from those of the word lines.

The channel layers 125, 135, and 145 include the first select channel layer 125, a cell channel layer 135 connected to an upper portion of the first select channel layer 125, and a second select channel layer 145 formed on an upper portion of the cell channel layer 135. The first select channel layer 125 is formed inside a channel hole 121 passing through the conductive pattern 113A that is the first select line and the insulation patterns 111A and 111B adjacent to the conductive pattern 113A. The channel hole 121 may further pass through the conductive pattern 113B, which is the first dummy word line, and the insulation pattern 111C that is adjacent to the conductive pattern 113B. In this case, the first select channel layer 125 may extend so as to further pass through the conductive pattern 113B, which is the first dummy word line, and the insulation pattern 111C adjacent to the conductive pattern 113B. The cell channel layer 135 is formed inside a channel hole 131 passing through the conductive patterns 113C to 113F, which are the cell word lines, and the insulation patterns 111D to 111F formed between the conductive patterns 113C to 113F. The second select channel layer 145 is formed inside a channel hole 141 passing through the conductive pattern 113H that is the second select line and the insulation patterns 111H and 111I adjacent to the conductive pattern 113H. The channel hole 141 may further pass through the conductive pattern 113G, which is the second dummy word line, and the insulation pattern 111G adjacent to the conductive pattern 113G. In this case, the second select channel layer 145 may extend so as to further pass through the conductive pattern 113G, which is the second dummy word line, and the insulation pattern 111G adjacent to the conductive pattern 113G.

Alternatively, at least one of the channel holes 121 and 141, passing through the conductive patterns 113A and 113H, which are the first and second lines, may also be formed so as to pass through a part of the conductive patterns for the word line. In this case, at least one of the first and second select channel layers 125 and 145 may further pass through the part of the conductive patterns for the word line.

In an exemplary embodiment, a resistance of the cell channel layer 135 is lower than that of at least one of the first select channel layer 125 or the second select channel layer 145. The cell channel layer 135 is formed by filling the channel hole 131 with a semiconductor layer. At least one of the first select channel layer 125 or the second select channel layer 145 may be formed as a semiconductor layer in a form of a tube.

In the meantime, center regions of the tube-shaped first select channel layer 125 or the tube-shaped second select channel layer 145 may be filled with the insulation layers 127 or 147, respectively. Further, a gate insulation layer 123 is formed between the first select channel layer 125 and the conductive patterns 113A and 113B. A gate insulation layer 143 is formed between the second select channel layer 145 and the conductive patterns 113G and 113H. A memory layer 133 is formed between the cell channel layer 135 and the conductive patterns 113C to 113F. The memory layer 133 may include a tunnel insulation layer, a data storage layer surrounding the tunnel insulation layer, and a charge blocking layer surrounding the data storage layer. The data storage layer may be a nitride layer to trap charges. At least one of the gate insulation layers 123 or 143 may be formed of the same material as that of the memory layer 133.

According to the aforementioned structure, the first select transistor is defined at a crossing portion of the conductive pattern 113A, which is the first select line, and the first select channel layer 125. The first dummy memory cell transistor is defined at a crossing portion of the conductive pattern 113B, which is the first dummy word line, and the first select channel layer 125. Further, the memory cell transistors are defined at crossing portions of the conductive patterns 113C to 113F, which are the cell word lines, and the cell channel layer 135. The second select transistor is defined at a crossing portion of the conductive pattern 113H, which is the second select line, and the second select channel layer 145. The second dummy memory cell transistor is defined at a crossing portion of the conductive pattern 113G, which is the second dummy word line, and the second select channel layer 145.

In an exemplary embodiment, the cell channel layer 135, of memory cells occupying a longest region of the memory string, has a filled structure to decrease resistance thereof, thereby decreasing channel resistance of the memory string.

In addition, in an exemplary embodiment, it is possible to decrease generation of leakage current due to the excessive decrease of the channel resistance of the memory string by forming at least one of the first select channel layer 125 or the second select channel layer 145, connected to the cell channel layer 135, in a tube shape and increasing a resistance of at least one of the first select channel layer 125 or the second select channel layer, formed in the tube shape, to be larger than that of the cell channel layer 135. Accordingly, in an exemplary embodiment, it is possible to improve a channel current by decreasing the channel resistance of the memory string, and to reduce current leakage at a side of the first select channel layer 125 or the second select channel layer 145. In an exemplary embodiment, it is possible to reduce a disturb phenomenon according to the current leakage.

Hereinafter, an exemplary method of manufacturing the above described semiconductor memory device will be described with reference to FIGS. 2A to 2E.

Referring to FIG. 2A, a first stacked structure ML1 is formed by alternately stacking first material layers 251 and second material layers 253 on the semiconductor substrate 101 including the impurity region 101A that is the common source line. The common source line may be formed by using the impurity region 101A, or by forming a conductive layer on the semiconductor substrate 101 and patterning the conductive layer.

The number of first material layers 251 and second material layers 253, included in the first stacked structure ML1, may be varied based on a number of stacks in the first select transistor and a number of stacks of the first dummy memory cell transistor that will be stacked on the semiconductor substrate 101.

The first material layers 251 of the flat stacked structure ML1 may be formed in regions where the insulation patterns will be formed. The second material layers 253 may be formed in regions where the first select line and the first dummy word line will be formed. The first material layers 251 may have an etching selectivity that is lower or higher than an etching selectivity of and the second material layers 253. For example, the first material layers 251 may be oxide layers that form insulation patterns, and the second material layers 253 may be nitride layers that form sacrificial layers. Alternatively, the first material layers 251 may be undoped polysilicon layers that form sacrificial layers, and the second material layers 253 may be doped polysilicon layers that form conductive patterns. Alternatively, the first material layers 251 may be oxide layers that form insulation patterns, and the second material layers 253 may be metal layers, metal silicide layers, or polysilicon layers that form conductive patterns.

After forming the first stacked structure ML1, a channel hole 121, passing through the first stacked structure ML1, is formed. Subsequently, the first select channel layer 125 is formed along a sidewall of the channel hole 121. The first select channel layer 125 may be formed by depositing a semiconductor layer along the sidewall of the channel hole 121. A silicon layer may be used as the semiconductor layer. In order to improve an electrical characteristic of the first select channel layer 125 by improving charge mobility, a process of crystallizing the semiconductor layer may be further performed after the semiconductor layer is deposited. In order to crystallize the semiconductor layer, a laser annealing technology, a Solid Phase Crystallization (SPC) technology, a Metal Induced Crystallization (MIC) technology, or the like may be used. After the first select channel layer 125 is formed, an inside of the channel hole 121, including the first select channel layer 125, is filled with the insulation layer 127. Accordingly, the first select channel layer 125, which is shaped like a tube, is formed.

The gate insulation layer 123 may be formed along the side all of the channel hole 121 before forming the first select channel layer 125. In this case, the tube-shaped first select channel layer 125 is surrounded with the gate insulation layer 123.

Referring to FIG. 2B, a second stacked structure ML2 including third material layers 261 and fourth material layers 263 is formed by alternately stacking the third material layers 261 and the fourth material layers 263 on the first stacked structure ML1, after the insulation layer 127 is formed in the channel hole 121. The number of third material layers 261 and fourth material layers 263, included in the second stacked structure ML2, may be varied based on a number of stacks of a memory cell transistor desired to be stacked on the semiconductor substrate 101.

The third material layers 261 of the second stacked structure ML2 may be formed in regions where the insulation patterns will be formed. The fourth material layers 263 are formed where the cell word lines will be formed. Materials of the third material layer 261 and the fourth material layers 263 are the same as those of the first material layers 231 and the second material layers 253, respectively, as described with reference to FIG. 2A.

After the second stacked structure ML2 is formed, the cell channel hole 131, passing through the second stacked structure ML2, is formed. Next, the cell channel layer 135 is formed inside the cell channel hole 131. The cell channel layer 135 may be formed by filling in the inside of the cell channel hole 131 with the semiconductor layer. Accordingly, the cell channel layer 135 having the filled structure is formed. A silicon layer may be used as the semiconductor layer. In order to improve an electrical characteristic of the cell channel layer 135 by improving charge mobility, a process of crystallizing the semiconductor layer may be further performed after the cell channel hole 131 is filled with the semiconductor layer. In order to crystallize the semiconductor layer, a laser annealing technology, a Solid Phase Crystallization (SPC) technology, a Metal Induced Crystallization (MIC) technology, or the like may be used.

Before the cell channel layer 135 is formed, the memory layer 133 may be further formed along a side all of the cell channel hole 131. In this case, the sidewall of the cell channel layer 135 is surrounded by the memory layer 133. The memory layer 133 may be formed by sequentially stacking the charge blocking layer, the data storage layer, the tunnel insulation layer, sequentially stacking the data storage layer and the tunnel insulation layer, or forming the tunnel insulation layer. The charge blocking layer and the tunnel insulation layer may be formed as an oxide layer, and the data storage layer may be formed as a nitride layer.

Referring to FIG. 2C, a third stacked structure ML3 including one or more fifth material layers 271 and one or more sixth material layers 273 is formed by alternately stacking the one or more fifth material layers 271 and the one or more sixth material layers 273 on the second stacked structure ML2. The number of the fifth material layers 271 and the number of the sixth material layers 273 included in the third stacked structure ML3 may be varied based on a number of stacks of the second select transistor and a number of stacks of the second dummy memory cell transistor to be stacked on the semiconductor substrate 101.

The fifth material layers 271 of the third stacked structure ML3 may be formed in regions where the insulation patterns will be formed. The sixth material layers 273 may be formed where the second select line and the second dummy word line will be formed. Materials of the fifth material layers 271 and the sixth material layers 273 are the same as the materials of the first material layers 231 and the second material layers 253, respectively, as described with reference to FIG. 2A.

After the third stacked structure ML3 is formed, the cell channel hole 141, passing through the third stacked structure ML3, is formed. Next, the second select channel layer 145 is formed along the sidewall of the channel hole 141. The second select channel layer 145 may be formed by depositing a semiconductor layer along the sidewall of the channel hole 141. A silicon layer may be used as the semiconductor layer. In order to improve an electrical characteristic of the second select channel layer 145 by improving charge mobility, a process of crystallizing the semiconductor layer may be further performed after the semiconductor layer is deposited. In order to crystallize the semiconductor layer, a laser annealing technology, a Solid Phase Crystallization (SPC) technology, a Metal Induced Crystallization (MIC) technology, or the like may be used. After the second select channel layer 145 is formed, the inside of the channel hole 141, including the second select channel layer 145, is filled with the insulation layer 147. Accordingly, the tube-shaped second select channel layer 145 is formed.

Before the second select channel layer 145 is formed, the gate insulation layer 143 may be formed along the sidewall of the channel hole 141. In this case, the tube-shaped second select channel layer 145 is surrounded by the gate insulation layer 143.

Although it is not illustrated in the drawing, a slit for dividing the first to third stacked structures ML1 to ML3, for each memory block or for each line, may be formed after the second select channel layer 145 is formed. A subsequent process may be various according to composition of the first to sixth material layers 251, 253, 261, 263, 271, and 273.

Referring to FIG. 2D, when the first, third, and fifth material layers 251, 261, and 271 serve as the insulation patterns, and the second, fourth, and sixth material layers 253, 263, and 273 serve as the sacrificial layers, only the second, fourth, and sixth material layers 253, 263, and 273, which are exposed through the slit, are removed by an etching process. Accordingly, conductive layer trenches T are formed at a region in which the second, fourth, and sixth material layers 253, 263, and 273 are removed.

Referring to FIG. 2E, internal portions of the conductive layer trenches T are filled with the conductive patterns 113A to 113H. The conductive patterns 113A to 113H are isolated by the insulation patterns 111A to 111I formed of the first, third, and fifth material layers 251, 261, and 271. Although it is not illustrated, at least one of an oxide layer or a nitride layer may be formed along surfaces of the conductive layer trenches T before the conductive layer trenches T are filled with the conductive patterns 113A to 113H.

Alternatively, if the first, third, and fifth material layers 251, 261, and 271 are formed as the sacrificial layers, and the second, fourth, and sixth material layers 253, 263, and 273 are formed as conductive patterns, only the first, third, and fifth material layers 251, 261, and 271, which are exposed through the slit are removed by an etching process. Accordingly, the insulation layer trenches are formed where the first, third, and fifth material layers 251, 261, and 271 are removed. Then, the insulation layer trenches are filled with the insulation patterns 111A to 111I. The conductive patterns 113A to 113H, formed of the second, fourth, and sixth material layers 253, 263, and 273, are left between the insulation patterns 111A to 111I.

Alternatively, if the first, third, and fifth material layers 251, 261, and 271 are formed as the insulation patterns, and the second, fourth, and sixth material layers 253, 263, and 273 are formed as the conductive patterns, the insulation patterns 111A to 111I formed of the first, third, and fifth material layers 251, 261, and 271 and the conductive patterns formed of the second, fourth, and sixth material layers 253, 263, and 273 are formed.

Figure 3C:
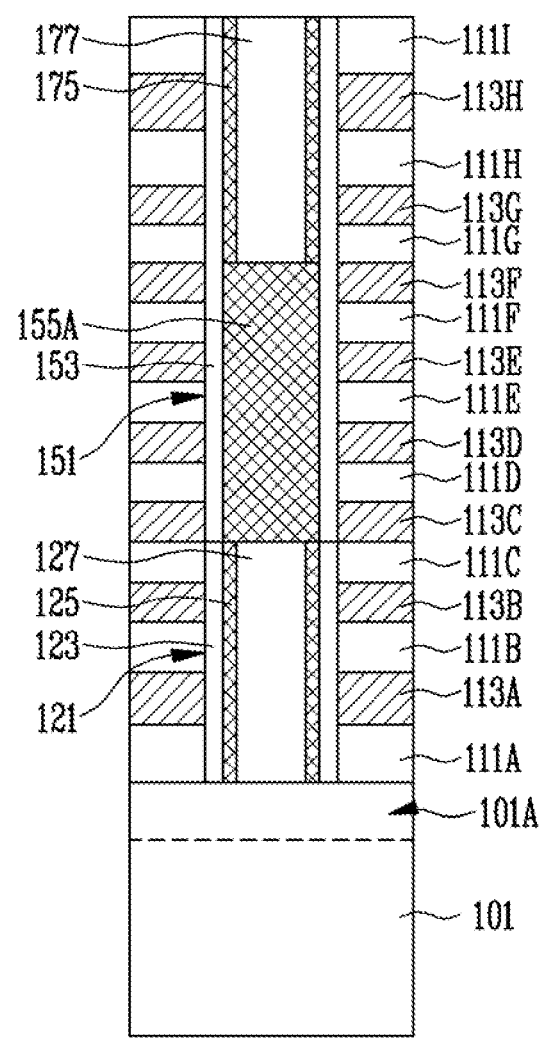

FIGS. 3A to 3C are cross-sectional views illustrating an exemplary semiconductor memory device and a method of manufacturing the same according. The exemplary semiconductor memory device and an exemplary memory string structure will be described in more detail with reference to FIG. 3C.

Referring to FIG. 3C, an exemplary memory string structure includes insulation patterns 111A to 111I and conductive patterns 113A to 113H alternately stacked on a semiconductor substrate 101, and channel layers 125, 155A, and 175 stacked on the substrate 101. The channel layers, 155A, and 175 pass through at least one of the insulation patterns 111A to 111I and the conductive patterns 113A to 113H.

An impurity region 101A, serving as a common source line, may be formed within the substrate 101. Alternatively, the common source line may be formed as a conductive layer stacked between the substrate 101 and the insulation pattern 111A adjacent to the substrate 101.

The usage of conductive patterns 113A to 113H may be substantially the same usage as the usage of the conductive patterns 113A to 113H described above with respect to FIG. 2E.

The channel layers 125, 155A, and 175 includes a first select channel layer 125, a cell channel layer 155A connected to an upper portion of the first select channel layer 125, and a second select channel layer 175 formed on an upper portion of the cell channel layer 155A. The first select channel layer 125 is formed inside a channel hole 121, as described above with respect to FIG. 2E. The cell channel layer 155A and the second select channel layer 175 are formed inside a single channel hole 151. The cell channel layer 155A may be formed at a portion of the channel hole 151 passing through the conductive patterns 113C to 113F, which are cell word lines, and passing through the insulation patterns 111D to 111F, which are formed between the conductive patterns 113C to 113F. The second select channel layer 175 may be formed at a portion of the single channel hole 151 passing through the conductive pattern 113H, which is the second select line, and passing through the insulation patterns 111H and 111I, adjacent to the conductive pattern 113H. The second select channel layer 175 may extend to a portion of the single channel hole 151 passing through the conductive pattern 113G, which is the second dummy word line, and passing through the insulation pattern 111G adjacent to the conductive pattern 113G.

A resistance of the cell channel layer 155A is formed to be lower than a resistance of at least one of the first select channel layer 125 or the second select channel layer 175. To this end, the cell channel layer 155A is formed by filling the single channel hole 151 with a semiconductor layer up to a predetermined height. At least one of the first select channel layer 125 or the second select channel layer 175 may be formed as a semiconductor layer shaped like a tube.

Center regions of the tube-shaped first select channel layer 125 and the second select channel layer 175 may be filled with insulation layers 127 and 177. Further, a gate insulation layer 123 is formed between the first select channel layer 125 and the conductive patterns 113A and 113B. A memory layer 153 is formed between the second select channel layer 175 and the conductive patterns 113G and 113H, and between the cell channel layer 155A and the conductive patterns 113C to 113F. The memory layer 153 may include a tunnel insulation layer, a data storage layer surrounding the tunnel insulation layer, and a charge blocking layer surrounding the data storage layer. The data storage layer may be a nitride layer in which a charge trap is possible. The memory layer 153 between the second select channel layer 175 and the conductive patterns 113G and 113H is used as the gate insulation layer. The gate insulation layer 123 formed between the first select channel layer 125 and the conductive patterns 113A and 113B may be formed of the same material as that of the memory layer 153.

An exemplary embodiment has the string structure in which the memory cell transistors are stacked between the first and second select transistors, as discussed above with respect to FIGS. 2A-2E. Further, an exemplary embodiment may further include at least one of the first and second dummy memory cell transistors, as discussed above with respect to FIGS. 2A-2E.

In an exemplary embodiment, a channel resistance of the memory string may be decreased by forming a cell channel layer 155A having a filled structure to decrease resistance of the cell channel layer 155A. In addition, in an exemplary embodiment, it is possible to decrease generation of leakage current due to the excessive decrease of the channel resistance of the memory string by forming at least one of the first select channel layer 125 or the second select channel layer 175 connected to the cell channel layer 155A in a tube shape and increasing a resistance of at least one of the first select channel layer 125 or the second select channel layer 175, formed in the tube shape, to be larger than that of the cell channel layer 155A.

Hereinafter, a method of forming an exemplary semiconductor memory device will be described with reference to FIGS. 3A to 3C.

Referring to FIG. 3A, a first stacked structure ML1 is formed on the semiconductor substrate 101, including the impurity region 101A that is the common source line, by the same process as that described in FIG. 2A. The channel hole 121, the gate insulation layer 123, the first select channel layer 125, and the insulation layer 127 passing through the first stacked structure ML1 are formed by a process that is similar to the process described with respect to FIG. 2A.

Next, a second stacked structure ML2, including third material layers 261 and fourth material layers 263, is formed by alternately stacking the third material layers 261 and the fourth material layers 263 on the first stacked structure ML1. Then, a third stacked structure ML3, including one or more fifth material layers 271 and one or more sixth material layers 273, is formed by alternately stacking the fifth material layers 271 and the sixth material layers 273 on the second stacked structure ML2. The third and fifth material layers 261 and 271 are formed of the same material as that of the first material layer 251, described above with respect to FIG. 2A. The fourth and sixth material layers 263 and 273 are formed of the same material as that of the second material layer, described above with respect to in FIG. 2A. The third and fifth material layers 261 and 271 may be formed where the insulation patterns will be formed, and the fourth and sixth material layers 263 and 273 may be formed where the cell word line, the dummy word line, and the second select line be formed.

Subsequently, the channel hole 151, passing through the second stacked structure ML2 and the third stacked structure ML3, is formed. Next, the semiconductor layer 155 is formed inside the channel hole 151. A silicon layer may be used as the semiconductor layer 155.

Before the semiconductor layer 155 is formed, the memory layer 153 may be further formed along a sidewall of the channel hole 151. The memory layer 153 may be formed by sequentially stacking the charge blocking layer, the data storage layer, the tunnel insulation layer, sequentially stacking the data storage layer and the tunnel insulation layer, or forming the tunnel insulation layer. The charge blocking layer and the tunnel insulation layer may be formed as an oxide layer, and the data storage layer may be a nitride layer.

Referring to FIG. 3B, a height of the semiconductor layer 155 may be reduced to a boundary of the second stacked structure ML2 and the third stacked structure ML3 by etching the semiconductor layer 155. Accordingly, a recess region 161 is formed, and the remaining semiconductor layer is defined as the cell channel layer 155A having the filled structure.

In order to improve an electric characteristic of the cell channel layer 155A by improving charge mobility, a process of crystallizing the semiconductor layer may be performed after the recess region 161 is formed or before the recess region 161 is formed. In order to crystallize the semiconductor layer, a laser annealing technology, a Solid Phase Crystallization (SPC) technology, a Metal Induced Crystallization (MIC) technology, or the like may be used.

Referring to FIG. 3C, the second select channel layer 175 is formed along a sidewall of the recess region 161. The second select channel layer 175 may be formed by depositing a semiconductor layer along the sidewall of the recess region 161. A silicon layer may be used as the semiconductor layer. In order to improve an electrical characteristic of the second select channel layer 175 by improving charge mobility, a process of crystallizing the semiconductor layer may be further performed after the semiconductor layer is deposited. In order to crystallize the semiconductor layer, a laser annealing technology, a Solid Phase Crystallization (SPC) technology, a Metal Induced Crystallization (MIC) technology, or the like may be used. After the second select channel layer 175 is formed, a center region of the second select channel layer 175 is filled with the insulation layer 177. Accordingly, the second select channel layer 175 shaped like a tube is formed.

Then, the conductive patterns 113A to 113H and the insulation patterns 111A to 111I may be formed by performing a process similar to the process described above with respect to FIGS. 2D and 2E.

Figure 4:
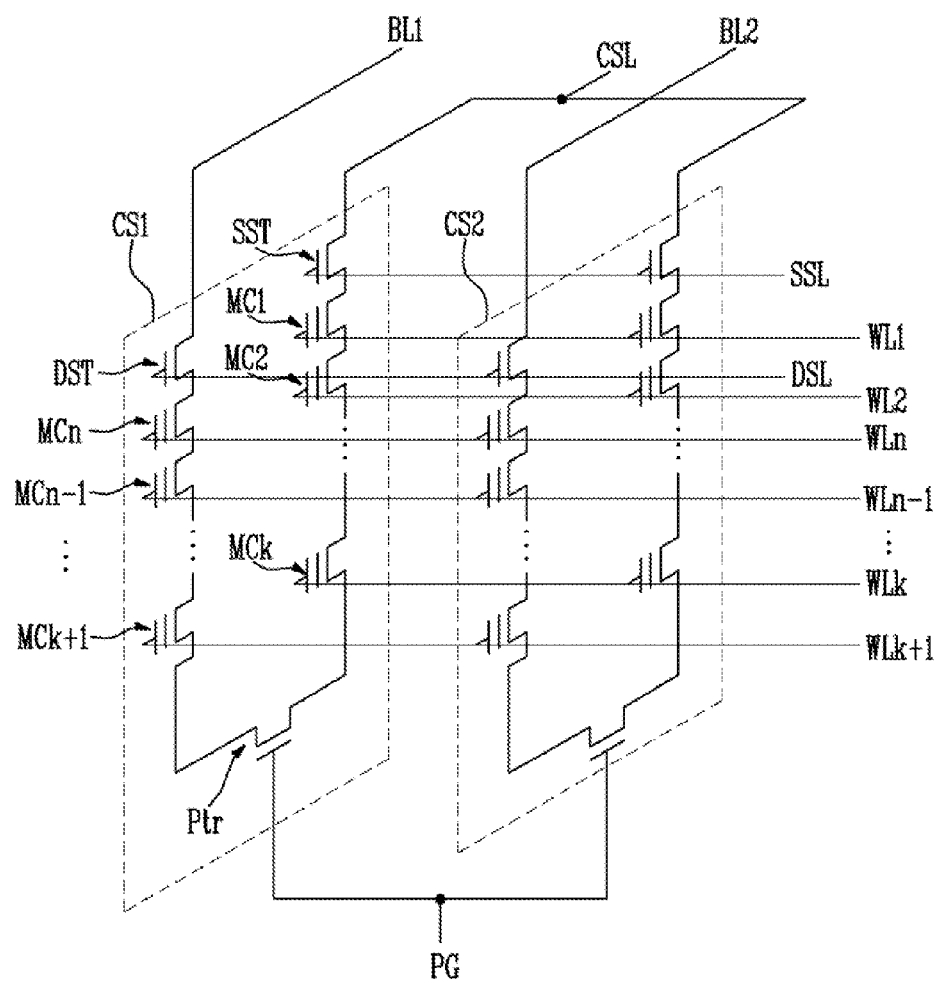
FIG. 4 is a circuit diagram of an exemplary semiconductor memory device.

FIG. 4 is a circuit diagram of a semiconductor memory device according an exemplary embodiment.

Referring to FIG. 4, an exemplary semiconductor memory device includes a common source line CSL, a plurality of bit lines BL1 and BL2, and a plurality of memory strings CS1 and CS2 connected between the common source line CSL and the plurality of bit lines BL1 and BL2.

The common source line CSL is a conductive line disposed on the plurality of memory strings CS1 and CS2. The plurality of memory strings CS1 and CS2 is connected to a lower portion of the common source line CSL.

Each of the plurality of bit lines BL1 and BL2 is a conductive line disposed on the plurality of memory strings CS1 and CS2, and is disposed on a different layer from that of the common source line CSL so as to be isolated from the common source line CSL. A series of memory strings arranged in an extending direction of each of the plurality of bit lines BL1 and BL2 is connected to each of the plurality of bit lines BL1 and BL2 in parallel.

Each of the plurality of memory strings CS1 and CS2 includes a first select transistor SST connected to the common source line CSL, a second select transistor DST connected to one of the plurality of memory strings CS1 and CS2, a pipe transistor Ptr formed under the first and second select transistors DST and SST, memory cell transistors MC1 to MCk of a first group stacked between the pipe transistor Ptr and the first select transistor SST, and memory cell transistors MCk+1 to MCn of a second group stacked between the pipe transistor Ptr and the second select transistor DST. The first select transistor SST, the memory cell transistors MC1 to MCk of the first group, the pipe transistor Ptr, and the memory cell transistors MCk+1 to MCn of the second group included in each of the plurality of memory strings CS1 and CS2 are connected in series through a channel layer.

A gate of the first select transistor SST is connected to a first select line SSL, and a gate the second select transistor DST is connected to a second select line DSL. Gates of the memory cell transistors MC1 to MCn of the first and second groups are connected to word lines WL1 to WLn. A gate of the pipe transistor is connected to a pipe gate PG. The first select line SSL, the word lines WL1 to WLn, and the second select line DSL may be formed in a line shape while extending in one direction. The gates of the first select transistors SST arranged on the same layer in the same direction as the extending direction of the first select line SSL may be commonly connected to the first select line SSL. The gates of the second select transistors DST arranged on the same layer in the same direction as the extending direction of the second select line DSL may be commonly connected to the second select line DSL. The gates of the plurality of memory cells arranged on the same layer in extending directions of the respective word lines WL1 to WLn may be commonly connected to each of the word lines WL1 to WLn. The pipe gate PG may be commonly connected to the plurality of pipe transistors Ptr included in a memory block. The pipe gate PG the first select line SSL, the word lines WL1 to WLn, and the second select line DSL may be formed as the conductive patterns sequentially stacked on the substrate.

FIGS. 5A to 5E are cross-sectional views illustrating an exemplary semiconductor memory device and a method of manufacturing the same. First, a memory string structure of an exemplary semiconductor memory device will be described in more detail with reference to FIG. 5E.

Figure 5A:
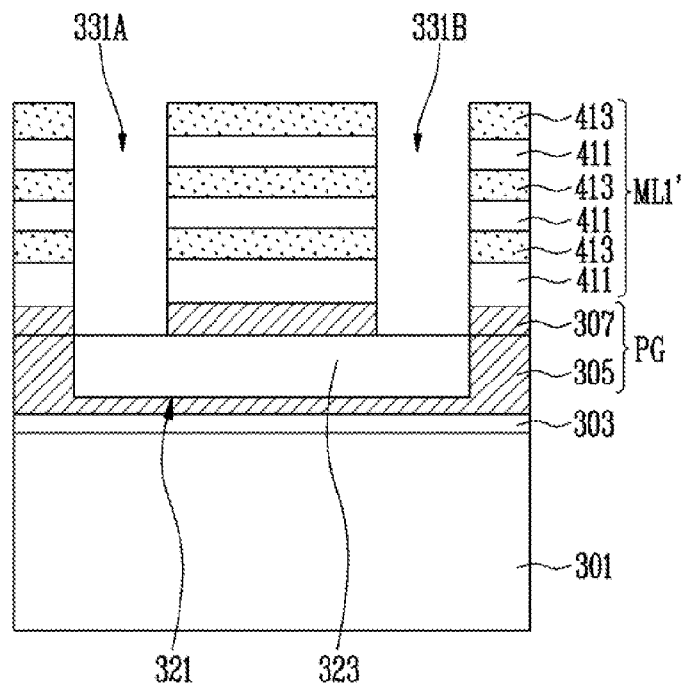
FIGS. 5A to 5E are cross-sectional views illustrating an exemplary semiconductor memory device and a method of manufacturing the same.
Figure 5B:
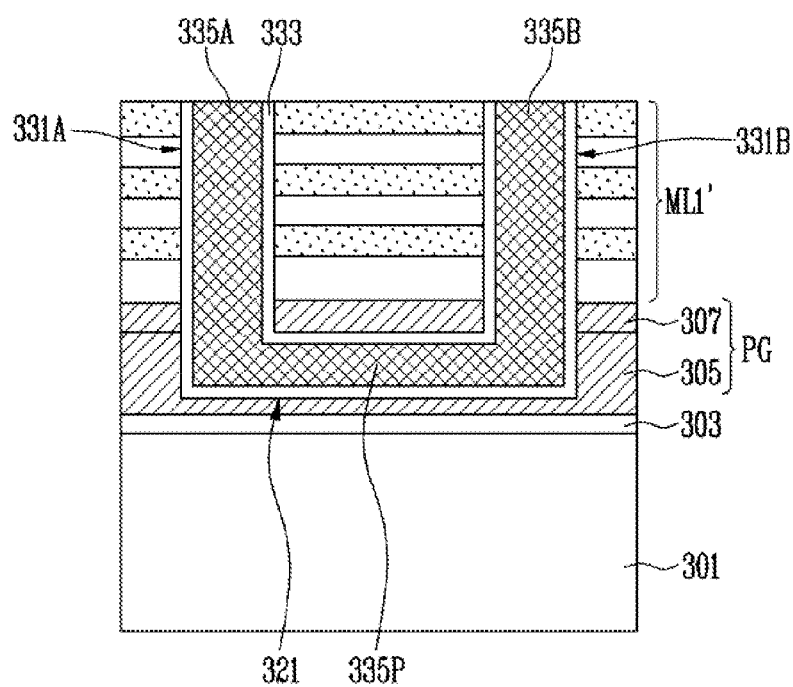
Figure 5C:
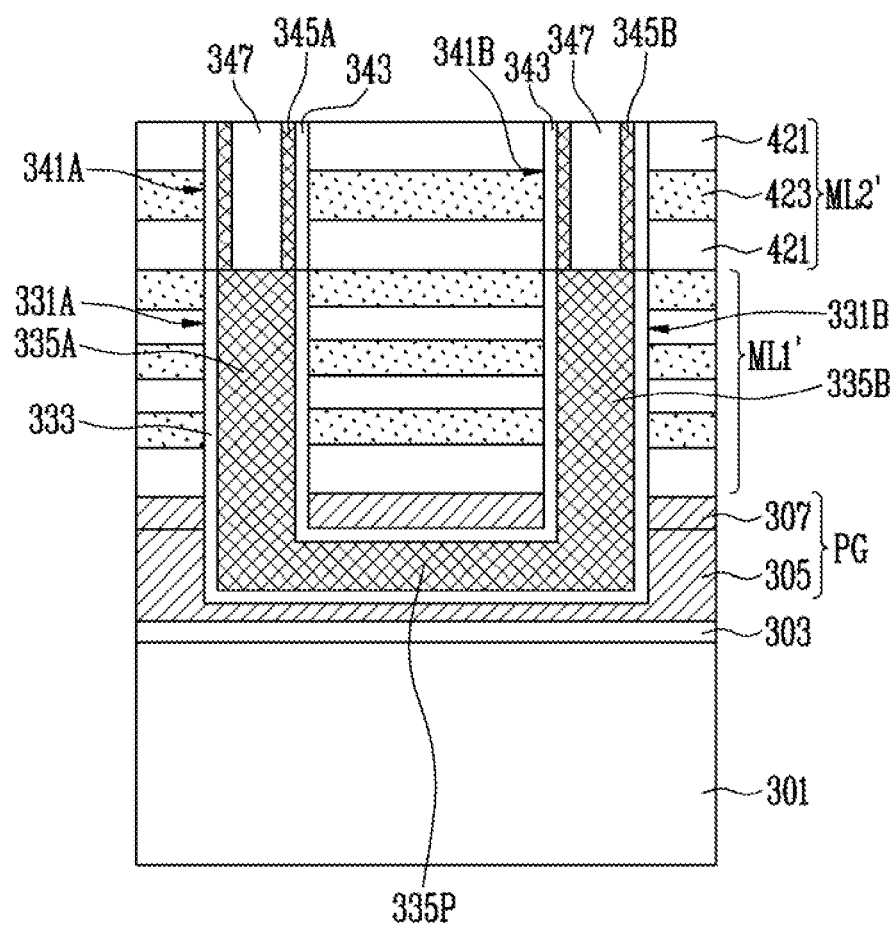
Figure 5D:
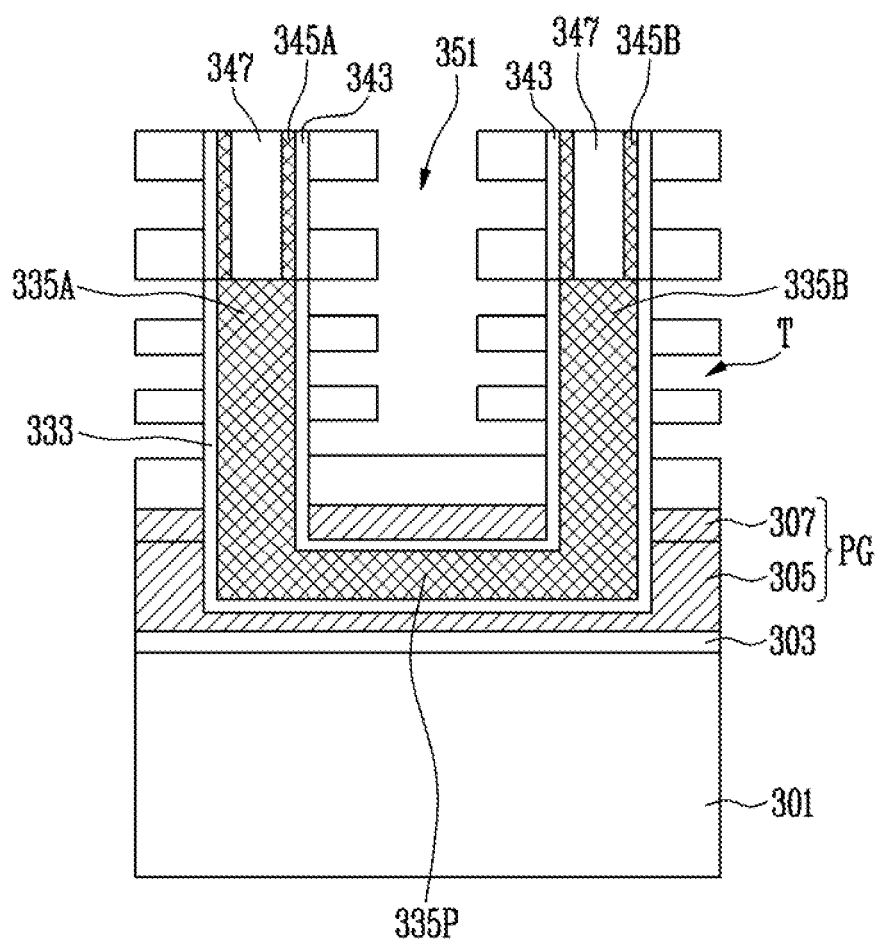
Figure 5E:
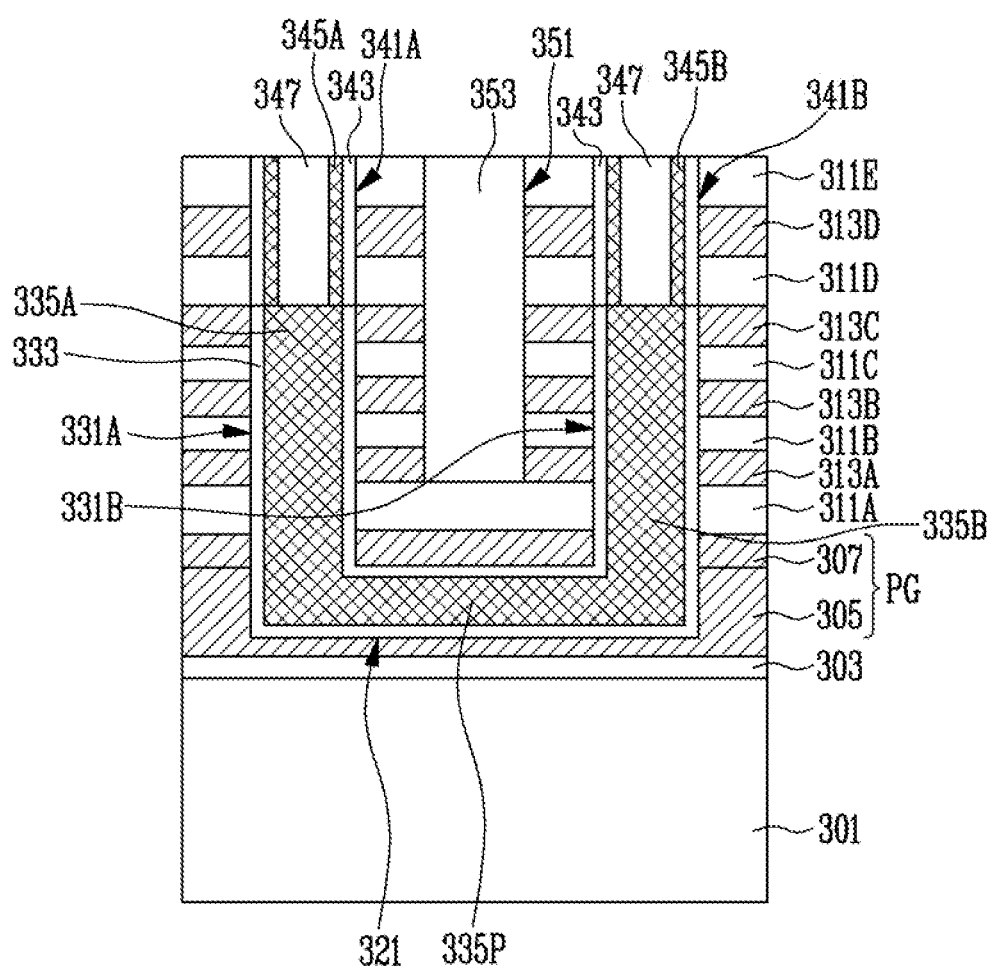

Referring to FIG. 5E, an exemplary memory string structure includes an insulation layer 303 formed on a semiconductor substrate 301, a pipe gate PG formed on the insulation layer 303, and insulation patterns 311A to 311E and conductive patterns 313A to 313D alternately stacked on the pipe gate PG.

The exemplary memory string structure includes a pipe channel layer 335P embedded in the pipe gate PG, cell channel layers 335A and 335B connected to the pipe channel layer 335P, and select channel layers 345A and 345B connected to the cell channel layers 335A and 335B.

The pipe gate PG includes a first pipe conductive layer 305 in which a pipe trench 321 is formed. The first pipe conductive layer 305 is formed so as to surround a bottom surface and a sidewall of a pipe channel layer 335P formed inside the pipe trench 321. The pipe gate PG may further include a second pipe conductive layer 307 formed on the first pipe conductive layer 305. The second pipe conductive layer 307 may be formed so as to cover an upper surface of the pipe channel layer 335P. An electric field applied to the pipe channel layer 335P through the second pipe conductive layer 307 is enhanced, thereby increasing channel current.

The insulation patterns 311A to 311E alternately formed with the conductive patterns 313A to 313D to form a stacked structure. The stacked structure is divided by a slit 351. An insulation layer 353 is formed inside the slit 351. The conductive patterns (for example, conductive patterns 313A to 313C) stacked on the pipe gate PG among the conductive patterns 313A to 313D may be cell word lines. The conductive patterns, which are formed on at least one layer (e.g., 313D) adjacently stacked on the conductive patterns 313A to 313C may be a first select line and a second select line.

The pipe channel layers 335P may be arranged in a matrix form including a plurality of columns and a plurality of rows. Each of the pipe channel layers 335P arranged in the matrix form connects a pair of cell channel layers 335A and 335B. Hereinafter, for the convenience of description, the cell channel layer connected to one end of the pipe channel layer 335P is defined as a first cell channel layer 335A, and the cell channel layer connected to the other end of the pipe channel layer 335P is defined as a second cell channel layer 335B.

The first cell channel layer 335A and the second cell channel layer 335B face each other with the slit 351 interposed between them. The first cell channel layer 335A and the second cell channel layer 335B are formed inside cell channel holes 331A and 331B, which pass through the conductive patterns 313A to 313C, and serve as the cell word lines and the insulation patterns 311A to 311D arranged under the conductive patterns 313A to 313C.

The select channel layers 345A and 345B include the first select channel layer 345A, connected to an upper portion of the first cell channel layer 335A, and a second select channel layer 345B connected to an upper portion of the second cell channel layer 335B. The first select channel layer 345A and the second select channel layer 345B face each other with the slit 351 interposed between them. The first select channel layer 345A is formed inside a channel hole 341A passing through the conductive pattern 313D that is the first select line and the insulation patterns 311D and 311E disposed under and on the conductive pattern 313D. The second select channel layer 345B is formed inside a channel hole 341B passing through the conductive pattern 313D that is the second select line and the insulation patterns 311D and 311E disposed under and on the conductive pattern 313D. Accordingly, each of the conductive patterns 313D and the insulation patterns 311D and 311E are formed in a structure surrounding at least one of the first and second select channel layers 345A and 345B.

In an exemplary embodiment, a resistance of the first a cell channel layer 335A and the second cell channel layer 335B is lower than a resistance of the first select channel layer 345A and the second select channel layer 345B. The first cell channel layer 335A and the second cell channel layers 335A and 335B are formed by filling the channel holes 331A and 331B with a semiconductor layer, and the first select channel layer 345A and the second select channel layer 345B may be formed as a semiconductor layer shaped like a tube.

In the meantime, the pipe channel layer 335P may be formed by filling an inside of the pipe trench 321 with the semiconductor layer. Center regions of the tube-shaped first select channel layer 345A and the tube-shaped second select channel layer 345B may be filled with an insulation layer 347. Further, a gate insulation layer 343 is formed between the first select channel layer 345A and the conductive pattern 313D, and between the second select channel layer 345B and the conductive pattern 313D. A memory layer 333 is formed between the first cell channel layer 335A and the conductive patterns 313A to 313C, and between the second cell channel layer 335B and the conductive patterns 313A to 313C. The memory layer 333 may include a tunnel insulation layer, a data storage layer surrounding the tunnel insulation layer, and a charge blocking layer surrounding the data storage layer. The data storage layer 333 may be formed as a nitride layer in which a charge trap is possible. The memory layer 333 may be further formed between the pipe gate PG and the pipe channel layer 335P.

According to the aforementioned structure, a first select transistor is defined at a crossing portion of the conductive pattern 313D, which is the first select line, and the first select channel layer 345A. The second select transistor is defined at a crossing portion of the conductive pattern 313D, which is the second select line, and the second select channel layer 345B. Further, memory cell transistors of a first group are defined at a crossing portion of the conductive patterns 313A to 313C, which are the cell word lines, and the first cell channel layer 335A. Memory cell transistors of a second group are defined at a crossing portion of the conductive patterns 313A to 313C, which are the cell word lines, and the second cell channel layer 335B. Further, a pipe transistor is defined at a crossing portion of the pipe gate PG and the pipe channel layer 335P.

In an exemplary embodiment, the cell channel layers 335A and 335B of the memory cells occupying the longest region of the memory string have filled structures to decrease resistance thereof, thereby decreasing channel resistance of the memory string. In addition, in the exemplary embodiment, the pipe channel layer 335P has a filled structure to decrease resistance thereof, thereby decreasing channel resistance of the memory string. In addition, the exemplary embodiment, it is possible to decrease a leakage current due to the excessive decrease of the channel resistance of the memory string by forming at least one of the first select channel layer 345A or the second select channel layer 345B connected to the cell channel layers 335A and 335B in a tube shape and increasing resistance of the first select channel layers 345A or the second select channel layers 345A and 345B to be larger than a resistance of the cell channel layers 335A and 335B. Accordingly, in an exemplary embodiment, it is possible to improve channel current by decreasing the channel resistance of the memory string, and decrease a disturb phenomenon according to leakage current by decreasing leakage current at a side of the select channel layer.

Hereinafter, a method of manufacturing an exemplary semiconductor memory device will be described with reference to FIGS. 5A to 5E.

Referring to FIG. 5A, the insulation layer 303 is formed on the substrate 301. Then, the first pipe conductive layer 305 is formed on the insulation layer 303, and the pipe trench 321 is formed by etching a part of the first pipe conductive layer 305. Next, the pipe trench 321 is filled with a pipe sacrificial layer 323. The second pipe conductive layer 307 may be further formed on the first pipe conductive layer 305 including the pipe sacrificial layer 323. Then, the pipe gate PG, separated in the unit of a memory block, may be formed by etching the first and second pipe conductive layers 305 and 307.

A first stacked structure ML1' is formed by alternately stacking first material layers 411 and second material layers 413 on the pipe gate PG. The number of the first material layers 411 and the second material layers 413 included in the first stacked structure ML1' may be varied based on a number of stacks of the memory cells to be stacked on the semiconductor substrate 301.

The first material layers 411 of the first stacked structure ML1' may be formed where insulation patterns will be formed. The second material layers 413 may be formed where the cell word lines will be formed. The first material layers 411 and the second material layers 413 may have different etching selectivities. For example, if the first material layers 411 are formed of an oxide to form the insulation patterns, and the second material layers 413 may be formed of a nitride layer to form sacrificial layers. Alternatively, if the first material layers 411 are formed of an undoped polysilicon to form sacrificial layers, and the second material layers 413 may be formed of doped polysilicon layers to form conductive patterns. Alternatively, if the first material layers 411 are formed of an oxide to form the insulation patterns, and the second material layers 413 may be formed of metal layers, metal silicide layers, or polysilicon layers to form the conductive patterns.

After forming the first stacked structure ML1', cell channel holes 331A and 331B, which pass through the first stacked structure ML1', and through which the pipe sacrificial layer 323 is exposed, are formed. If the second pipe conductive layer 307 is formed on the pipe sacrificial layer 323, then the cell channel holes 331A and 331B pass through the second pipe conductive layer 307. The pipe sacrificial layer 323 may be exposed by one pair of cell channel holes 331A and 331B.

Referring to FIG. 5B, the pipe sacrificial layer 323 is removed, via the cell channel holes 331A and 331B, by an etching process. In order to protect the first material layers 411 and the second material layers 413 during the removal of the pipe sacrificial layer 323, a passivation layer (not shown) may be formed on sidewalls of the cell channel holes 331A and 331B before the removal of the pipe sacrificial layer 323. The passivation layer may be formed of a material having an etching selectivity that is less than an etching selectivity of the pipe sacrificial layer 323. The passivation layer may be removed after the removal of the pipe sacrificial layer 323. The pipe trench 321 is exposed after the pipe sacrificial layer 323 is removed.

Subsequently, the pipe channel layer 335P, the first cell channel layer 335A, and the second cell channel layer 335B are formed in the pipe trench 321 and the cell channel holes 331A and 331B are formed, respectively. The pipe channel layer 335P, the first cell channel layer 335A, and the second cell channel layer 335B may be formed in the pipe trench 321 and inside the cell channel holes 331A and 331B with the semiconductor layer. The pipe channel layer 335P, first cell channel layer 335A, and the second cell channel layer 335B have a filled structure. A silicon layer may be used as the semiconductor layer. In order to improve an electrical characteristic of the first channel layer 335a and the second cell channel layer 335B by improving charge mobility, a process of crystallizing the semiconductor layer may be further performed after the pipe trench 321 and the cell channel holes 331A and 331B are filled with the semiconductor layer. In order to crystallize the semiconductor layer, a laser annealing technology, a Solid Phase Crystallization (SPC) technology, a Metal Induced Crystallization (MIC) technology, or the like may be used.

Before the pipe channel layer 335P, the first cell channel layer 335A, and the second cell channel layer 335B are formed, the memory layer 333 may be further formed along surfaces of the pipe trench 321 and the cell channel holes 331A and 331B. The memory layer 333 may be formed by sequentially stacking the charge blocking layer, the data storage layer, the tunnel insulation layer, sequentially stacking the data storage layer and the tunnel insulation layer, or forming the tunnel insulation layer. The charge blocking layer and the tunnel insulation layer may be oxide layers, and the data storage layer may be a nitride layer.

Referring to FIG. 5C, a second stacked structure ML2', including one or more third material layers 421 and one or more fourth material layers 423, is formed by alternately stacking the third material layers 421 and the fourth material layers 423 on the first stacked structure ML1', after forming the first and second cell channel layers 335A and 335B. A number of third material layers 421 and fourth material layers 423 included in the second stacked structure ML2' may be varied based on a number of stacks of the first and second select transistors desired to be stacked on the semiconductor substrate 301.

The third material layers 421 of the second stacked structure ML2' may be formed where insulation patterns will be formed. The fourth material layers 423 may be formed where the first select line and the second select line will be formed. Materials of the third material layers 421 and the fourth material layers 423 are the same as those of the first material layer 411 and the second material layer 413, respectively, as described above with respect to FIG. 5A.

After the second stacked structure ML2' is formed, channel holes 341A and 341B, which pass through the second stacked structure ML2' and connect to the cell channel holes 331A and 331B, are formed. The channel holes 341A and 341B include the first channel hole 341A, through which the first cell channel layer 335A is exposed, and the second channel hole 341B, through which the second cell channel layer 335B is exposed.

Next, the first select channel layer 345A and the second select channel layer 345B are formed along the sidewalls of the first channel hole 341A and the second channel hole 341B, respectively. The first select channel layer 345A and the second select channel layer 345B may be formed along the sidewalls of the first channel hole 341A and the second channel hole 341B, respectively, by depositing the semiconductor layer. A silicon layer may be used as the semiconductor layer. In order to improve an electrical characteristic of the first and second select channel layers 345A and 345B by improving charge mobility, a process of crystallizing the semiconductor layer may be further performed after the semiconductor layer is deposited. In order to crystallize the semiconductor layer, a laser annealing technology, a Solid Phase Crystallization (SPC) technology, a Metal Induced Crystallization (MIC) technology, or the like may be used. After the first select channel layer 345A and the second select channel layer 345B are formed, the insulation layer 347 is formed inside the first channel hole 341, including the first select channel layer 345A and inside the second channel hole 341B, including the second select channel layer 345B. Accordingly, the first select channel layer 345A and second select channel layer 345B shaped like a tube are formed.

Before the first and second select channel layers 345A and 345B are formed, the gate insulation layer 343 may be further formed along the sidewall of each of the first and second channel holes 341A and 341B. In this case, each of the tube-shaped first select channel layer 345A and the tube-shaped second select channel layer 345B are surrounded by the gate insulation layer 343.

Referring to FIG. 5D, the slit 351, passing through the second stacked structure ML2' between the first select channel layer 345A and the second select channel layer 345B, and passing through the first stacked structure ML1' may be formed. A subsequent process may be various according to composition of the first to fourth material layers 411, 413, 421, and 423.

If the first material layers 411 and the third material layers 421 serve as the insulation patterns, and the second material layers 413 and the fourth material layers 423 are the sacrificial layers, then only the second material layers 413 and the fourth material layers 423, which are exposed through the slit 351, are removed by an etching process. Accordingly, conductive layer trenches T are formed at a region in which the second material layers 413 and the fourth material layers 423 have been removed.

Referring to FIG. 5E, the conductive patterns 313A to 313D are formed inside the conductive layer trenches T. The conductive patterns 313A to 313H are isolated by the insulation patterns 311B to 311E, which are formed of the first material layers 411 and the third material layer 421 respectively. Although not illustrated in the drawings, before the conductive patterns 313A to 313D are formed inside the conductive layer trenches T, at least one of an oxide layer or a nitride layer may be formed along the surface of the conductive layer trenches T.

Alternatively, (not illustrated in the drawings), if the first material layers 411 and the third material layers 421 are sacrificial layers, and the second material layers 413 and the fourth material layers 423 serve as the conductive patterns, then only the first material layers 411 and the third material layers 421, which are exposed through the slit 351, are removed by an etching process. Accordingly, the insulation layer trenches are formed on the regions in which the first material layers 411 and the third material layers 421 are removed. Then, the insulation patterns 311A to 311E are formed in the insulation layer trenches. The second material layers 413 and the fourth material layers 423, which serve as the conductive patterns 313A to 313D, are left between the insulation patterns 311A to 311D.

Alternatively, (not illustrated in the drawings), if the first material layers 411 and the third material layers 421 are to serve as the insulation patterns, and the second material layers 413 and the fourth material layers 423 are to serve as the conductive patterns, then the insulation patterns 311A to 311E, which are separated by the slit 351 and are formed of the first material layers 411 and the third material layers 421, and the conductive patterns 313A to 313D, which are separated by the slit 351 and formed of the second material layers 413 and the fourth material layers 423, are formed.

The insulation patterns 311A to 311D and the conductive patterns 313A to 313D are formed by the aforementioned method and then the insulation layer 353 is filled inside the slit 351.

Figure 6A:
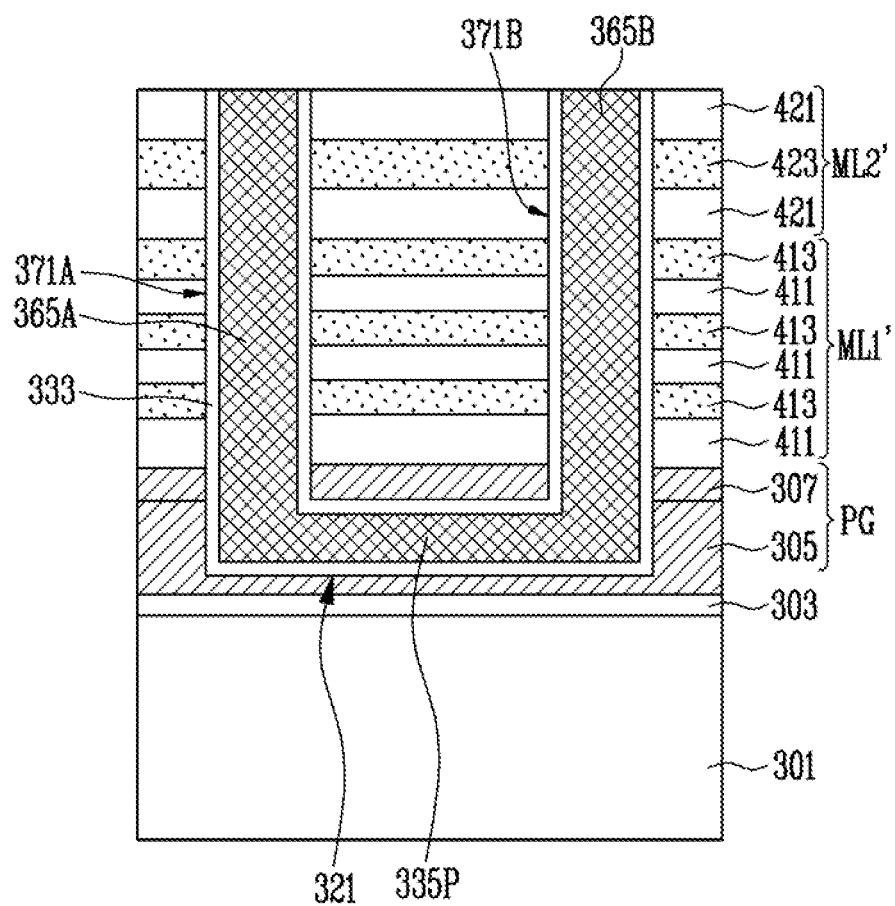
FIGS. 6A to 6C are cross-sectional views illustrating an exemplary semiconductor memory device and a method of manufacturing the same.
Figure 6B:
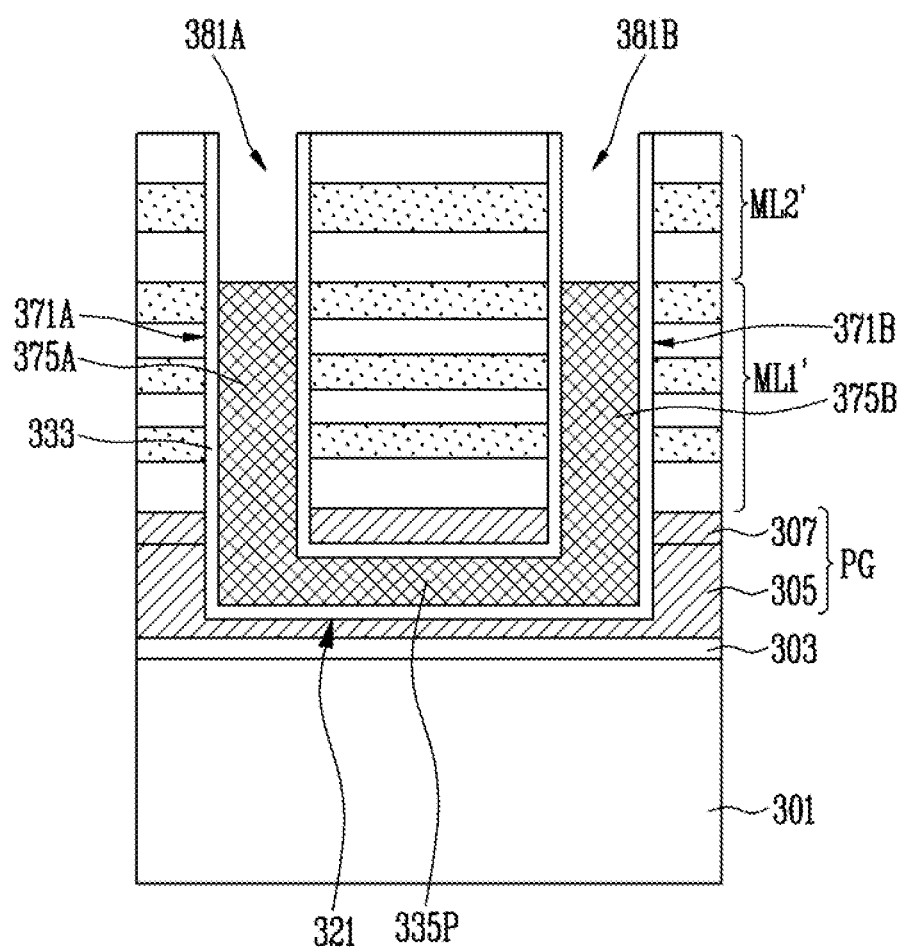
Figure 6C:
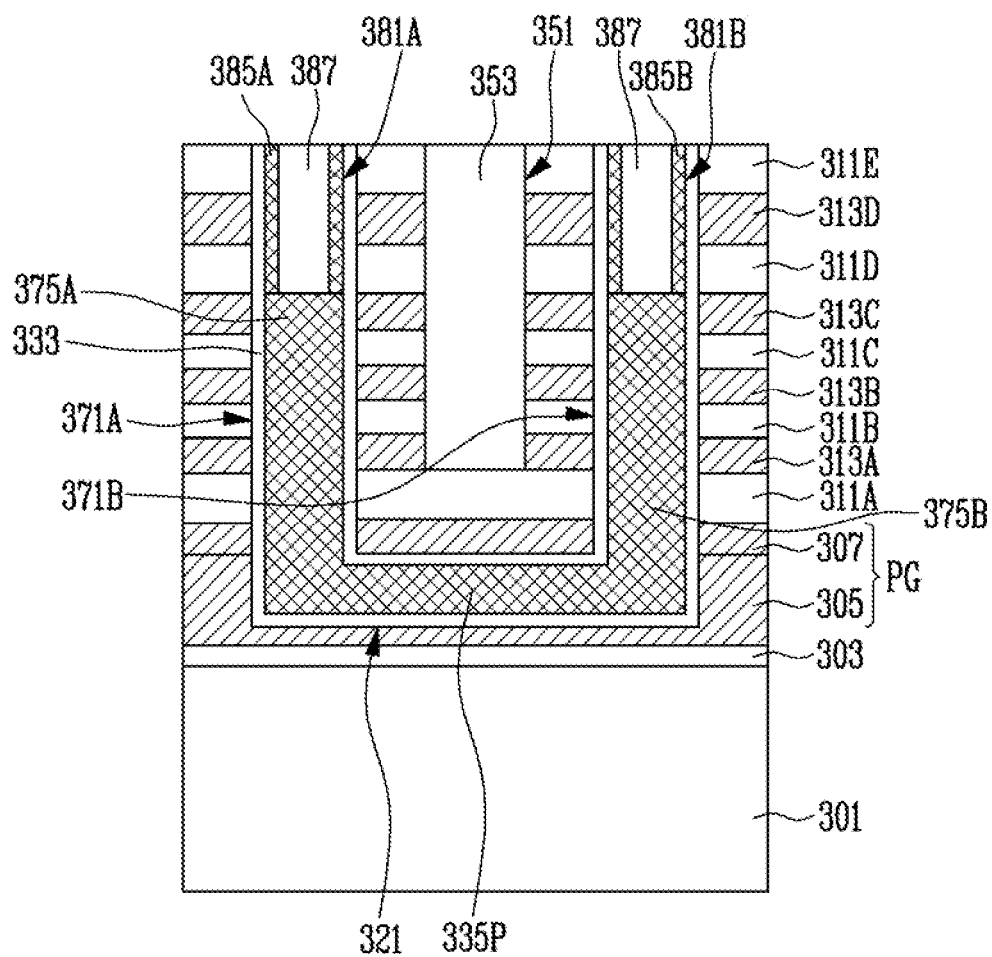

FIGS. 6A to 6C are cross-sectional views illustrating an exemplary semiconductor memory device and a method of manufacturing the same. First, an exemplary memory string structure of the semiconductor memory device will be described in more detail with reference to FIG. 6C.

Referring to FIG. 6C, the exemplary memory string structure includes an insulation layer 303 formed on a semiconductor substrate 301, a pipe gate PG formed on the insulation layer 303, and insulation patterns 311A to 311E and conductive patterns 313A to 313D alternately stacked on the pipe gate PG.

The exemplary memory string structure includes a pipe channel layer 335P embedded in the pipe gate PG, cell channel layers 375A and 375B connected to the pipe channel layer 335P, and select channel layers 385A and 385B connected to the cell channel layers 375A and 375B.

The pipe gate PG includes a first pipe conductive layer 305 in which a pipe trench 321 is formed. The first pipe conductive layer 305 is formed so as to surround a bottom surface and a sidewall of the pipe channel layer 335P formed inside the pipe trench 321. The pipe gate PG may further include a second pipe conductive layer 307 formed on the first pipe conductive layer 305. The second pipe conductive layer 307 may be formed so as to cover an upper surface of the pipe channel layer 335P. An electric field applied to the pipe channel layer 335P through the second pipe conductive layer 307 is enhanced, thereby increasing channel current.

The insulation patterns 311A to 311E are alternately stacked with the conductive patterns 313A to 313D to form a stacked structure. The stacked structure ids divided by a slit 351. An insulation layer 353 is formed inside the slit 351. The conductive patterns 313A to 313D may be have a usage similar to the conductive patterns 313A to 313D shown in FIG. 5E.

The pipe channel layers 335P may be arranged in a matrix form including a plurality of columns and a plurality of rows. Each of the pipe channel layers 335P arranged in the matrix form connects a pair of cell channel layers 375A and 375B. Hereinafter, for the convenience of description, the cell channel layer connected to one end of the pipe channel layer 335P is defined as the first cell cannel layer 375A, and the cell channel layer connected to the other end of the pipe channel layer 335P is defined as a second cell channel layer 375B.

The first cell channel layer 375A and the second cell channel layer 375B face each other with the slit 351 interposed between them. The select channel layers 385A and 385B include the first select channel layer 385A connected to an upper portion of the first cell channel layer 375A and a second select channel layer 385B connected to an upper portion of the second cell channel layer 375B. The first select channel layer 385A and the second select channel layer 385B face each other with the slit 351 interposed between them.

The first cell channel layer 375A and the first select channel layer 385A are formed inside one channel hole 371A. The second cell channel layer 375B and the second select channel layer 385B are formed inside a single channel hole 371B. The first channel hole 371A and the second channel hole 371B pass through the insulation patterns 311A to 311E and the conductive patterns 313A to 313D. The first channel hole 371A and the second channel hole 371B may further pass through the second pipe conductive layer 307. The first cell channel layer 375A and the second cell channel layer 375B may be formed at portions of the first channel hole 371A and the second channel hole 371B, respectively, which pass through the conductive patterns 313A to 313C, which are the cell word lines, and which pass through the insulation patterns 311A to 311C, adjacent to the conductive patterns 313A to 313C. Further, the first cell channel layer 375A and the second cell channel layer 375B may extend up to portions of the first channel hole 371A and the second channel hole 371B, respectively, passing through the second pipe conductive layer 307.

The first select channel layer 385A and second select channel layer 385B may be formed at portions of the first channel hole 371A and the second channel hole 371B, respectively, which pass through the conductive pattern 113D, which is the select line, and which pass through the insulation patterns 311D and 311E, adjacent to the conductive pattern 113D.

In an exemplary embodiment, a resistance of the first cell channel layers 375A and the second cell channel layers 375B is lower than a resistance of the first select channel layer 385A and the second select channel layer 385B. The first cell channel layer 375A and the second cell channel layer 375B are formed by forming a semiconductor layer, having a predetermined height, inside the channel holes 371A and 371B. Thus, the first select channel layer 385A and the second select channel layers 385B may be formed as a semiconductor layer shaped like a tube.

The pipe channel layer 335P may be formed by filling the inside of the pipe trench 321 with the semiconductor layer. Center regions of the tube-shaped first and second select channel layers 385A and 385B may be filled with an insulation layer 387. A memory layer 333 is formed between the first cell channel layer 375A and the conductive patterns 313A to 313C, and between the second cell channel layer 375B and the conductive patterns 313A to 313C. The memory layer 333 may include a tunnel insulation layer, a data storage layer surrounding the tunnel insulation layer, and a charge blocking layer surrounding the data storage layer. The data storage layer 333 may be a nitride layer in which a charge trap is possible. The memory layer 333 may be further formed between the pipe gate PG and the pipe channel layer 335P, between the first select channel layer 385A and the conductive patterns 313D, and between the second select channel layer 385B and the conductive pattern 313D to be used as the gate insulation layer.

According to the aforementioned structure, the exemplary embodiment includes a string structure in which memory cell transistors of a first group are stacked between the pipe transistor and the first select transistor, and memory cell transistors of a second group are stacked between the pipe transistor and the second select transistor.

In the exemplary embodiment, the cell channel layers 375A and 375B have filled structures to decrease resistance thereof, thereby decreasing channel resistance of the memory string. In addition, in the exemplary embodiment, the pipe channel layer 335P has a filled structure to decrease resistance thereof, thereby decreasing channel resistance of the memory string. In addition, in the exemplary embodiment, it is possible to decrease generation of leakage current due to the excessive decrease of the channel resistance of the memory string by forming at least one of the first select channel layer 385A and or the second select channel layer 385B in a tube shape and increasing resistance of the first select channel layer 385A or the second and the select channel layer 385B to be larger than a resistance of the cell channel layers 375A and 375B.

Hereinafter, an exemplary method of manufacturing the exemplary semiconductor memory device will be described with reference to FIGS. 6A to 6C.

Referring to FIG. 6A, the insulation layer 303, the first pipe conductive layer 305 including the pipe trench 321 filled with the pipe sacrificial layer 323, and the second pipe conductive layer 307 are formed on the substrate 301 by a process similar to that described with respect to FIG. 5A. Then, the pipe gate PG separated in the unit of a memory block may be formed by etching the first pipe conductive layer 305 and the second pipe conductive layers 307.

Subsequently, a first stacked structure ML1', including a first material layers 411 and second material layers 413, is formed by alternately stacking the first material layers 411 and the second material layers 413 on the pipe gate PG. Then, a second stacked structure ML2', including one or more third material layers 421 and one or more fourth material layers 423, is formed by alternately stacking the third material layers 421 and the fourth material layers 423 on the first stacked structure ML1'. Materials of the first to fourth material layers 411, 413, 421, and 423 are the same as those described above with respect to FIGS. 5A-5E. The first material layers 411 and the third material layers 421 may be formed where the insulation patterns will be formed. The second material layers 413 and the fourth material layers 423 may be formed where the cell word line and the select line will be formed.

Then, the channel holes 371A and 371B, which pass through the first stacked structure ML1' and the second stacked structure ML2' to expose the pipe sacrificial layer 323, are formed. If the second pipe conductive layer 307 is formed on the pipe sacrificial layer 323, then the channel holes 371A and 371B further pass through the second pipe conductive layer 307. The pipe sacrificial layer 323 may be exposed by one pair of channel holes 371A and 371B.

The pipe sacrificial layer 323 is removed, via the cell channel holes 371A and 371B, by an etching process to expose the pipe trench 321 is opened.

Next, the semiconductor layer is formed in the pipe trench 321 and the channel holes 371A and 371B. A silicon layer may be used as the semiconductor layer. The semiconductor layer formed inside the pipe trench 321 is defined as the pipe channel layer 335P. The semiconductor layer formed in the channel hole 371A at one end in of the pipe channel layer 335P is defined as the first channel layer 365A, and the semiconductor layer filled in the channel hole 371B at the other end of the pipe channel layer 335P is defined as the second channel layer 365B The memory layer 333 may be formed along surfaces of the pipe trench 321 and the channel holes 371A and 371B before the semiconductor layer is formed. The memory layer 333 may be formed by sequentially stacking the charge blocking layer, the data storage layer, the tunnel insulation layer, sequentially stacking the data storage layer and the tunnel insulation layer, or forming the tunnel insulation layer. The charge blocking layer and the tunnel insulation layer may be an oxide layer, and the data storage layer may be a nitride layer.

Referring to FIG. 6B, heights of the first channel layer 365A and the second channel layer 365B may be reduced up to a boundary of the first stacked structure ML1' and the second stacked structure ML2' by etching the first channel layer 365A and the second channel layer 365B. Accordingly, recess regions 381A and 381B are formed, and the remaining first channel layer 365A and the second channel layer 365B are defined as the first cell channel layer 375A and the second cell channel layer 375B, respectively, having the filled structure.

In order to improve electric characteristics of the pipe channel layer 335P, the first cell channel layer 375A, and the second cell channel layer 375B by improving charge mobility, a process of crystallizing the semiconductor layer may be further performed after the recess regions 381A and 381B are formed or before the recess regions 381A and 381B are formed. In order to crystallize the semiconductor layer, a laser annealing technology, a Solid Phase Crystallization (SPC) technology, a Metal Induced Crystallization (MIC) technology, or the like may be used.

Referring to FIG. 6C, the first select channel layer 385A and the second select channel layers 385B are formed along sidewalls of the recess regions 381A and 381B. The first select channel layer 385A and the second select channel layer 385B may be formed by depositing a semiconductor layer along the sidewalls of the recess regions 381A and 381B. A silicon layer may be used as the semiconductor layer. In order to improve the electrical characteristics of the first select channel layer 385A and the second select channel layer 385B by improving charge mobility, a process of crystallizing the semiconductor layer may be further performed after the semiconductor layer is deposited. In order to crystallize the semiconductor layer, a laser annealing technology, a Solid Phase Crystallization (SPC) technology, a Metal Induced Crystallization (MIC) technology, or the like may be used. After the first select channel layer 385A and the second select channel layer 385B are formed, center regions of the first select channel layer 385A and second select channel layer 385B are filled with the insulation layer 387. Accordingly, a tube-shaped first select channel layer 385A and a tube-shaped second select channel layers 385A and 385B are formed.

Then, the conductive patterns 313A to 313D and the insulation patterns 311A to 311E may be formed by performing a process similar to that described above with respect to FIGS. 5D and 5E.

Figure 7:
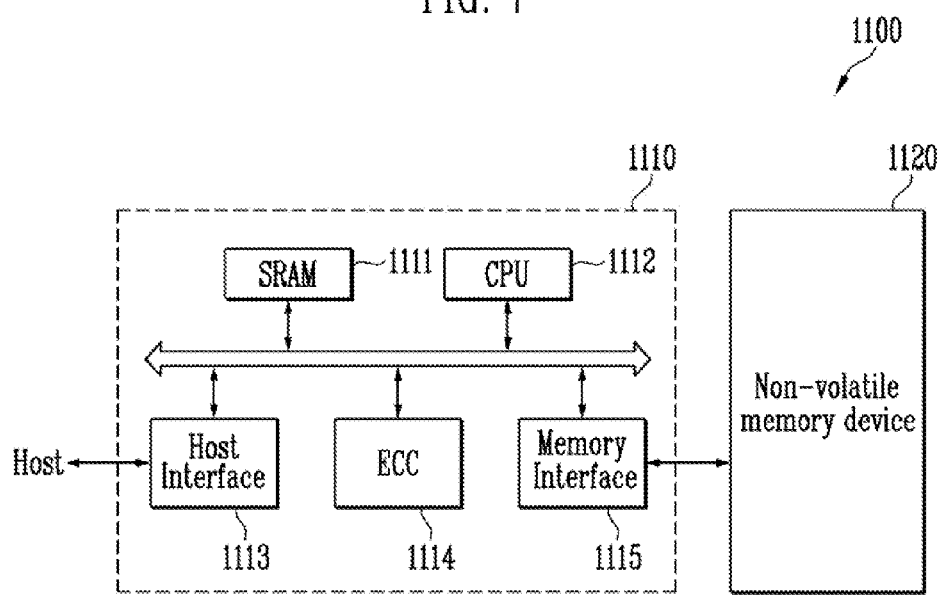
FIG. 7 is a configuration diagram illustrating an exemplary memory system.

FIG. 7 is a configuration diagram illustrating an exemplary memory system.

Referring to FIG. 7, a memory system 1100 according to an embodiment of the present invention may include a non-volatile memory device 1120 and a memory controller 1110.

The non-volatile memory device 1120 includes an exemplary semiconductor memory device, as described above with respect to FIGS. 1 to 6C. Further, the non-volatile memory device 1120 may be a multi-chip package including a plurality of flash memory chips.

The memory controller 1110 is configured to control the non-volatile memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol of a host connected with the memory system 1100. Further, the ECC 1114 detects and corrects an error included in data read from the non-volatile memory device 1120, and the memory interface 1115 performs interfacing with the non-volatile memory device 1120. In addition, the memory controller 1110 may further include a ROM, and the like for storing code data for interfacing with a host.

As described above, the memory system 1110 including the aforementioned configuration may be a memory card or a Solid State Disk (SSD) in which the non-volatile memory device 1120 is combined with the memory controller 110. For examples, when the memory system 1110 is the SSD, the memory controller 1110 may communicate with an external device (for example, a host) through one among various interface protocols, such as USB, MMC, PCI-E, SATA, PATA, SCSI, ESDI, and IDE.

Figure 8:
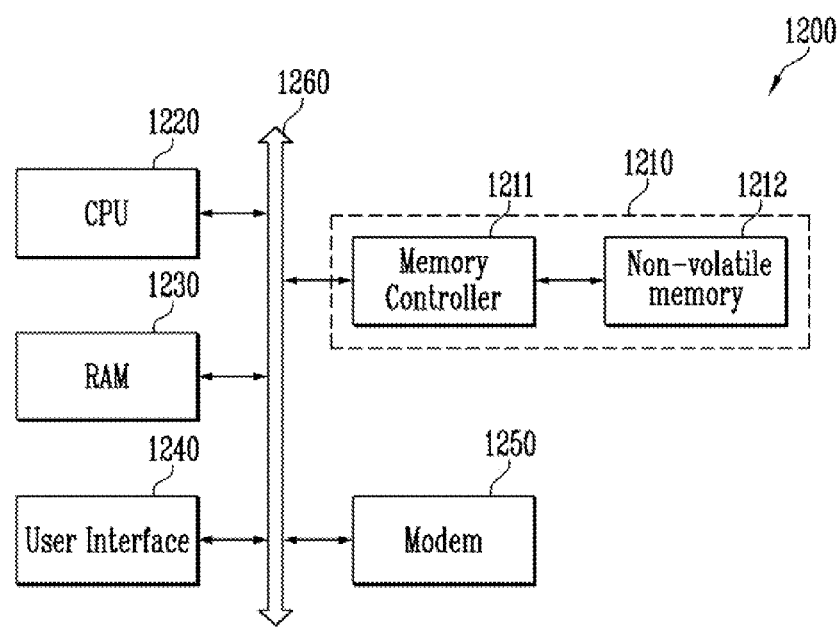
FIG. 8 is a configuration diagram illustrating an exemplary computing system.

FIG. 8 is a configuration diagram illustrating an exemplary computing system.

Referring to FIG. 8, an exemplary computing system 1200 may include a CPU 1220 electrically connected to a system bus 1260, a RAM 1230, a user interface 1240, a modem 1250, and a memory system 1210. When the computing system 1200 is a mobile device, a battery for supplying an operation voltage to the computing system 1200 may be additionally provided, and an application chipset, a Camera Image Processor (CIS), a mobile DRAM, and the like may be further included.

The memory system 1210 may include a non-volatile memory 121 and a memory controller 1211 as described with reference to FIG. 7.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device, comprising:
   insulation patterns and cell word lines alternately stacked on a substrate;
   cell channel layers formed through the insulation patterns and the cell word lines;
   select channel layers connected to the cell channel layers, the select channel layers each having a resistance higher than a resistance of each of the cell channel layers; and
   select lines surrounding the select channel layers.

2. The semiconductor memory device of claim 1, further comprising:
   cell channel holes formed through the insulation patterns and the cell word lines, wherein the cell channel layers are formed in the cell channel holes, respectively.

3. The semiconductor memory device of claim 1, further comprising:
   an insulation layer formed in each of the select channel layers.

4. The semiconductor memory device of claim 1, wherein the select channel layers comprise:
   a first select channel layer connected to a lower portion of each of the cell channel layers; and
   a second select channel layer connected to an upper portion of each of the cell channel layers.

5. The semiconductor memory device of claim 1, further comprising
   a pipe channel layer connecting a pair of the cell channel layers.

6. The semiconductor memory device of claim 1, further comprising:
   dummy word lines formed between the cell word lines and select lines closest to the cell word lines.

7. The semiconductor memory device of claim 6, wherein each of the select channel layers extends through a corresponding dummy word line.

8. A method of manufacturing a semiconductor memory device, the method comprising:
   forming a first stacked structure by alternately stacking a plurality of first material layers and second material layers on a substrate;
   forming cell channel layers passing through the first stacked structure; and
   forming select channel layers to connected to the cell channel layers, wherein each of the select channel layers has a resistance that is greater than a resistance of the cell channel layer.

9. The method of claim 8, wherein the forming the cell channel layers comprises:
   forming cell channel holes through the first stacked structure; and
   forming a silicon layer in each of the cell channel holes.

10. The method of claim 9, further comprising:
    forming a second stacked structure by stacking at least one third material layer and at least one fourth material layer on the first stacked structure after the forming of the cell channel layers.

11. The method of claim 10, wherein the forming the select channel layers comprises:
    forming channel holes through the second stacked structure;
    forming a silicon layer along a sidewall of each of the channel holes; and
    forming an insulation layer on the silicon layer.

12. The method of claim 8, further comprising:
    forming a second stacked structure by stacking at least one third material layer and at least one fourth material layer on the first stacked structure before the forming of the cell channel layers.

13. The method of claim 12, wherein the forming the cell channel layers comprises:
    forming channel holes through the first stacked structure and through the second stacked structure;
    forming a first silicon layer in each of the channel holes; and
    forming a recess region by etching the first silicon layer to a boundary of the first stacked structure and the second stacked structure.

14. The method of claim 13, wherein the forming the select channel layers comprises:
    forming a second silicon layer along a sidewall of the recess region; and
    forming an insulation layer on the second silicon layer.

15. The method of claim 8, further comprising:
    forming a third stacked structure by stacking at least one fifth material layer and at least one sixth material layer on the substrate before the forming of the first stacked structure.

16. The method of claim 15, wherein the forming the select channel layers comprises:
    forming channel holes through the third stacked structure;
    forming a silicon layer along a sidewall of each of the channel holes; and
    forming an insulation layer on the silicon layer.

17. The method of claim 16, further comprising:
    crystallizing the silicon layer.

18. The method of claim 8, further comprising:
    forming a pipe gate on the substrate before the forming of the first stacked structure;
    forming a pipe trench by etching the pipe gate; and
    forming a pipe sacrificial layer in the pipe trench.

19. The method of claim 18, further comprising:
    forming channel holes through the first stacked structure to expose the pipe sacrificial layer before the forming of cell channel layers
    exposing the pipe trench by removing the pipe sacrificial layer; and
    forming a pipe channel layer in the pipe trench.

20. The method of claim 19, further comprising:
    crystallizing at least one of the cell channel layers, the select channel layers, or the pipe channel layer.

* * * * *